(12) United States Patent
Imamura et al.

(10) Patent No.: US 7,246,044 B2
(45) Date of Patent: Jul. 17, 2007

(54) METHOD FOR AIDING SPACE DESIGN USING NETWORK, SYSTEM THEREFOR, AND SERVER COMPUTER OF THE SYSTEM

(75) Inventors: Kayo Imamura, Moriguchi (JP); Ryuji Fukushima, Shijounawate (JP); Hiroyasu Nakanishi, Nara (JP); Yasunori Nishimori, Osaka (JP); Yasushi Tsuda, Hirakata (JP); Katsuyuki Aoi, Neyagawa (JP)

(73) Assignee: Matsushita Electric Works, Ltd., Osaka (JP)

( * ) Notice: Subject to any disclaimer, the term of this patent is extended or adjusted under 35 U.S.C. 154(b) by 786 days.

(21) Appl. No.: 09/949,761

(22) Filed: Sep. 12, 2001

(65) Prior Publication Data

US 2002/0032546 A1    Mar. 14, 2002

(30) Foreign Application Priority Data

Sep. 13, 2000   (JP) ............................. 2000-278433

(51) Int. Cl.
*G06F 17/50* (2006.01)
(52) U.S. Cl. .................. 703/1; 703/21; 705/1; 345/588
(58) Field of Classification Search .................... 703/1, 703/21; 345/588; 705/1
See application file for complete search history.

(56) References Cited

U.S. PATENT DOCUMENTS 6,314,404 B1 * 11/2001 Good et al. ..................... 705/1
6,594,633 B1 * 7/2003 Broerman ....................... 705/1
6,821,206 B1 * 11/2004 Ishida et al. ................... 463/43

(Continued)

FOREIGN PATENT DOCUMENTS

JP       10-97558       4/1998

(Continued)

OTHER PUBLICATIONS

Rau-Chaplin et al., "The LaHave House Project: Towards an Automated Architectural Design Service", Proceedings of the International Conference on Computer-Aided Design, Sep. 1996, 8 pages.*

(Continued)

*Primary Examiner*—Kamini Shah
*Assistant Examiner*—Herng-der Day
(74) *Attorney, Agent, or Firm*—Greenblum & Bernstein, P.L.C.

(57) ABSTRACT

Provided is an environment which enables a user to implement 3D space design on a computer accessible to a server computer via a network. The server computer includes a layout design program which is operable on a screen activated by a browser of the client computer to enable the user to implement space design of a layout in the terms of a 2D image, an object database which stores object data used for layout design for retrieval and extraction, and a 3D display program which is operable on the browser screen of the client computer to display the designed space in the terms of a 3D image. The client computer is equipped with the browser capable of executing programs of the layout design program and the 3D display program. Upon receiving the layout design program and the 3D display program from the server computer via the network, the programs of the layout design program and the 3D display program are executable on the browser screen.

29 Claims, 33 Drawing Sheets

U.S. PATENT DOCUMENTS

| | | | |
|---|---|---|---|
| 6,839,880 B1* | 1/2005 | Morse et al. | 715/513 |
| 6,859,768 B1* | 2/2005 | Wakelam et al. | 703/1 |
| 7,080,096 B1* | 7/2006 | Imamura | 707/104.1 |
| 2001/0047251 A1* | 11/2001 | Kemp | 703/1 |

FOREIGN PATENT DOCUMENTS

| | | |
|---|---|---|
| KR | 200059246 | 10/2000 |

OTHER PUBLICATIONS

Housing Spatial Layout Planning System and Method in Web Environment, Translation of Korean Patent Document No. 20000059246, published Oct. 5, 2000.*

Building System Device for Architectural/Living Space Furniture Layout and Related Data Using the Internet, Translation of Japan Patent Document No. 10-97558, published Apr. 1998.*

English Language Abstract of JP 10-97558.

A printout of a World Wide Web site, Megasoft home page, http://www.megasoft.co.jp/, 1 page, printed on Dec. 13, 2001.

A printout of a World Wide Web site, e-Housebank home page, http://www.e-housebank.com/main.html, 2 pages, printed on Dec. 13, 2001.

A printout of a World Wide Web site, Fukui Computer home page, http://www.fukuicompu.co.jp/main.htm, http://www.fukuicompu.co.jp/main.htm, 2 pages, printed on Dec. 13, 2001.

Chan et al., "A Solid Modeling Library for the World Wide Web", Computer Networks and ISDN Systems, vol. 30, No. 20-21, pp. 1853-1863, Nov. 12, 1998.

Rau-Chaplin et al., "Graphics Support for a Word-Wide-Web Based Architectural Design Service", Computer Networks and ISND Systems, vol. 29, No. 14, pp. 1611-1623, Oct. 1, 1997.

Harder et al., "Supporting Adaptable Technical Information Systems in Heterogeneous Environments—Using WWW and ORDBMS", Database and Expert Systems Applications, IEEE Proceedings Eighth International Workshop, pp. 295-303, Sep. 1, 1997.

Bajaj et al., "Web Based Collaborative CAAD", Online! 1998, retrieved on Sep. 19, 2002, pp. 1-17; & Bajaj et al., Web Based Collaborative CAAD, Proceedings of the 1999 Fifth ACM Symposium on Solid Modeling and Applications, Jun. 1999, pp. 326-327.

Lewis et al., "Generation of 3D Building Models from 2D Architectural Plans", Computer-Aided Design, vol. 30, No. 10, pp. 765-779, Sep. 1998.

Sauce et al., "A Knowledge-Based System for Construction-Site Organization", Microcomputers in Civil Engineering, vol. 10, No. 3, pp. 187-197, 1995.

English Language Abstract of JP 10-97558, Apr. 1998.

* cited by examiner

FIG.3
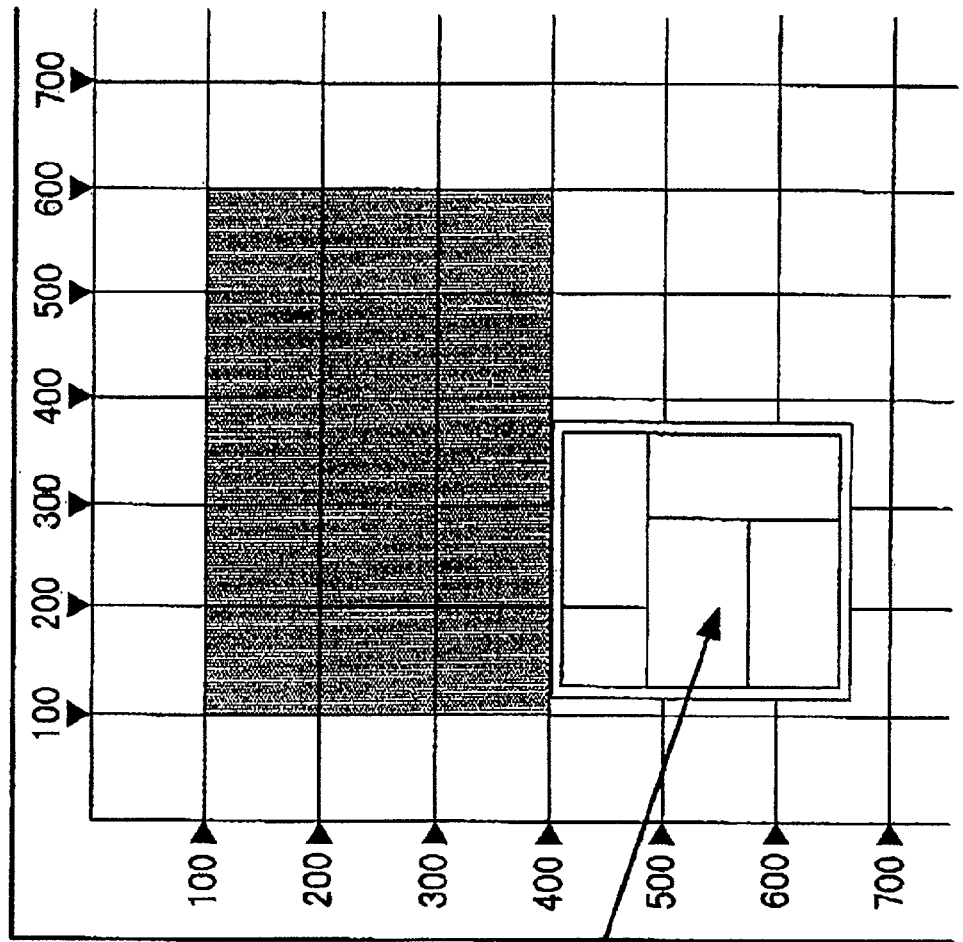
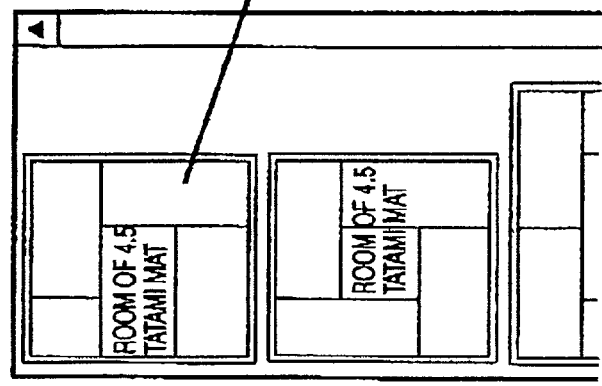

↓ 3D IMAGE DISPLAY

DRAG CORNER END OF A WINDOW PANE TO CHANGE SIZE/SHAPE OF WINDOW

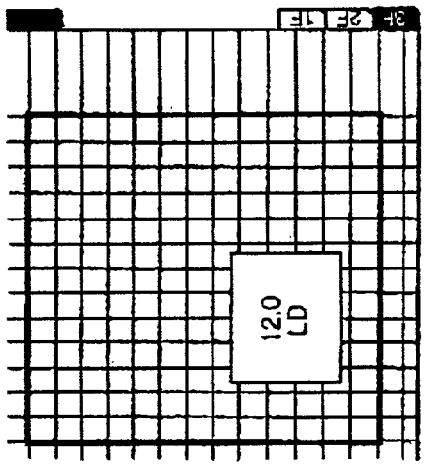
FIG.9D
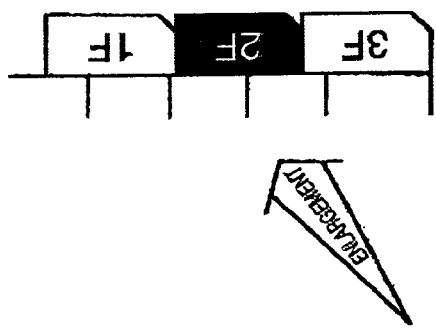
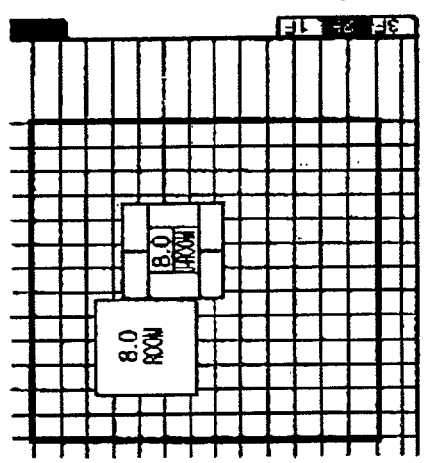
FIG.9B
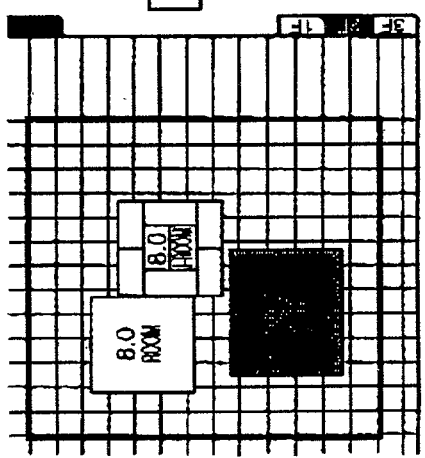
FIG.9C
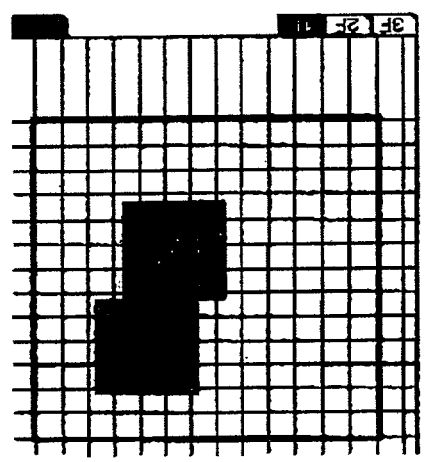
FIG.9A

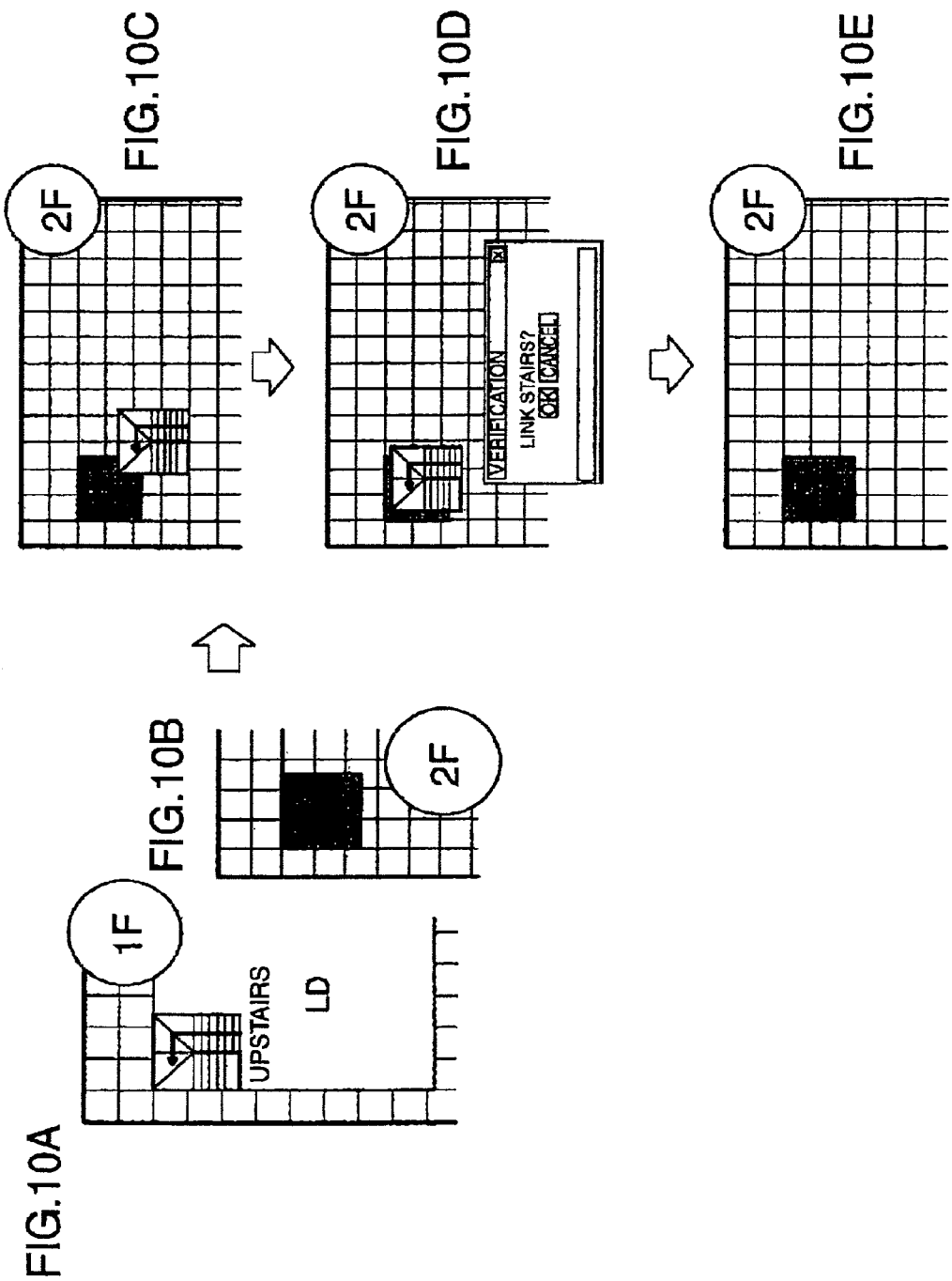

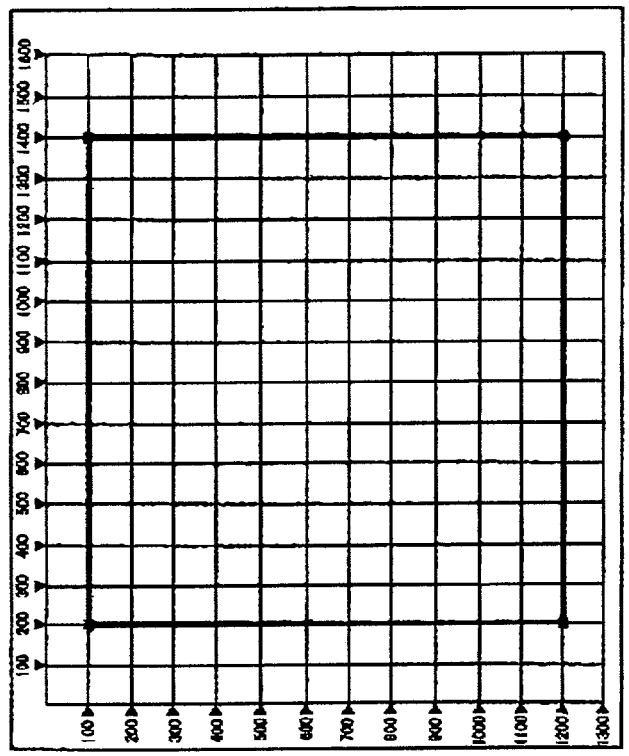
FIG.11C
FIG.11D
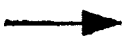
FIG.11A
FIG.11B

FIG. 12D DETERMINE

FIG. 12A DESIGN SITE

BEFORE :BEFORE REFORMING
AFTER  :AFTER REFORMING

METHOD FOR GATHERING
CUSTOMERS TO SHOWROOM

MOVING BUSINESS SUPPORT METHOD

FIG.28A

REQUIREMENTS

| REGION | DALLAS OR ITS SUBURB |
|---|---|
| RENTAL RATE | US$800/MONTH |
| TIME FOR MOVING IN | AROUND JUNE, 2001 |
| LAYOUT | 3LDK · · m² |

↓ SEARCH

FIG.28B

LIST OF HOUSINGS

| ADDRESS | RENTAL RATE (INCL. COMMON UTILITIES FEES) | ALLOWABLE DATE FOR MOVING | AGENCY | LAYOUT REGISTERED? | |
|---|---|---|---|---|---|
| · · | · · | AROUND AUGUST, 2001 | COMPANY A | YES | → VIEW 3D LAYOUT |
| · · | · · | AROUND MAY, 2001 | COMPANY A | YES | → VIEW 3D LAYOUT |
| · · | · · | AROUND MARCH, 2001 | COMPANY B | NO | |
| · · | · · | AROUND DECEMBER, 2001 | COMPANY A | YES | → VIEW 3D LAYOUT |

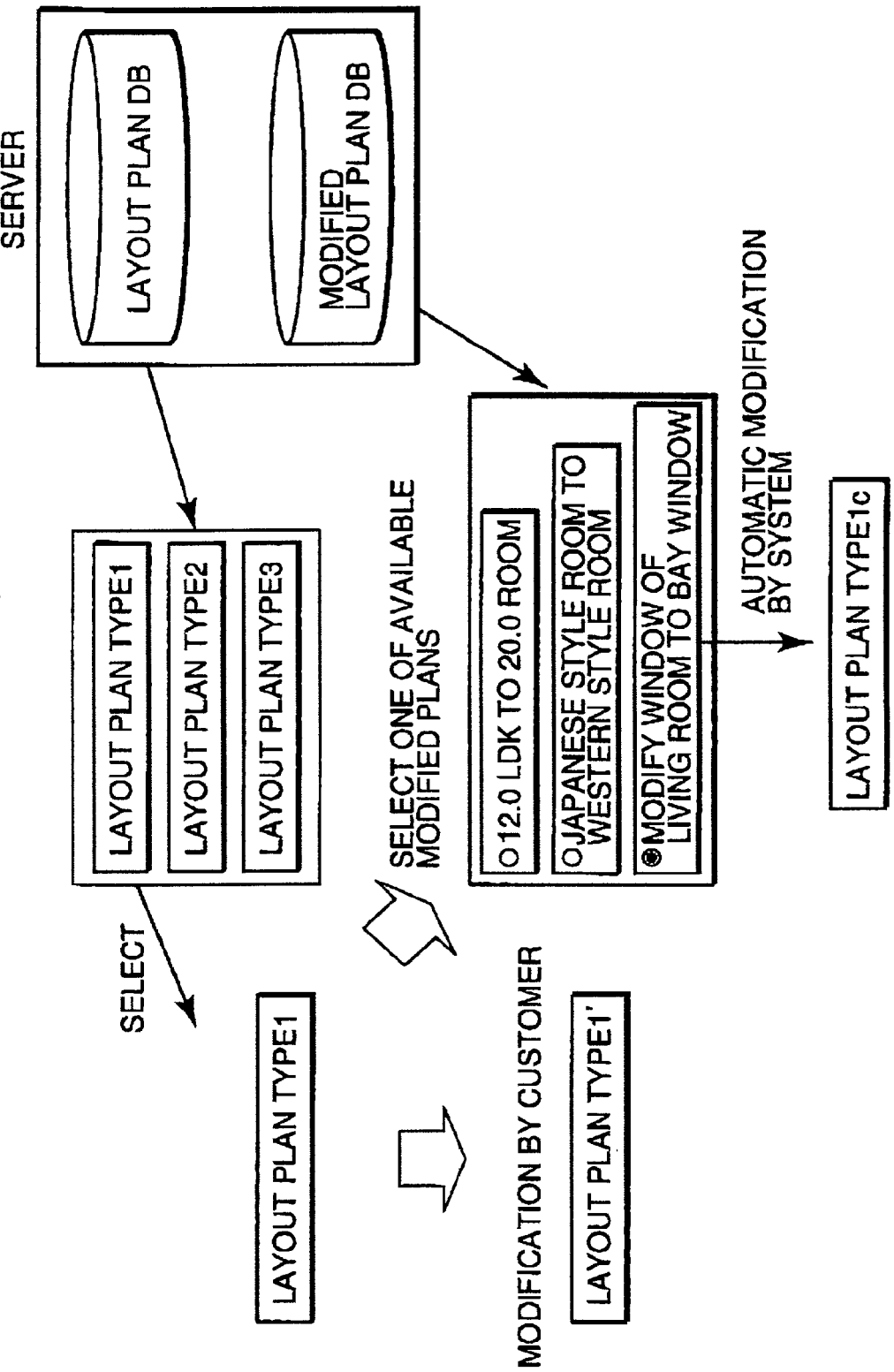

METHOD FOR AIDING SPACE DESIGN USING NETWORK, SYSTEM THEREFOR, AND SERVER COMPUTER OF THE SYSTEM

BACKGROUND OF THE INVENTION

1. Field of the Invention

This invention relates to space design aiding method and system using a network to provide a user with an environment for space design in the terms of three dimensional (3D) images on a website or homepage provided on networks such as the Internet, and a server computer for use in such system.

2. Description of the Related Art

Heretofore, there has been known systems which enables users to implement space design of a layout in a house in the terms of a 3D image by using the Internet and browse the designed space. The systems includes the following websites, for example:

1̂ http://www.e.housebank.com/

This website is adapted to realize a system which enables a user to implement space design as 3D image using a network and to be given an expert advice concerning the designed space via the network. According to this system, the user is required to download a design tool program (hereinafter referred to as ("tool") from the website and install the tool on his/her computer.

2̂ http://www.megasoft.co.jp/

This website is adapted to realize as a system which enables a user to download merely data regarding fixture via a network. According to this system, a user is required to purchase a design program and install the program on his/her computer.

3̂ http://www.fukuicompu.co.jp/

This website is adapted to realize a system which enables a user to download data regarding design objects via a network.

Also, Japanese Unexamined Patent Publication No. 10-97558 discloses a system which enables a user to implement space design as 3D image using a network. This system requires a condition that a program for enabling a user to perform 3D design has been loaded in his/her computer in advance.

According to the conventional systems, a user has to download a layout design tool and a browsing tool from the website and install these tools on his/her computer, or has to purchase an appropriate program and install the program on his/her computer in advance to utilize the system.

In other words, there has been no system available in which all the conditions for an environment for enabling a user to perform 3D design of a layout have been provided on a network.

In the conventional system in which a user has to install a program on his/her computer to use the system, the user has to install the program on computers individually. Accordingly, in the case where a user wishes to use the system at home as well as in the office, the user is required to install the program in the office and at home, respectively. Further, in the case where the computer in current use is out of order, the same drawback is involved because the user has to install the program on another computer to utilize the system.

SUMMARY OF THE INVENTION

In view of the above, it is an object of this invention to provide an environment which enables anyone, at anytime, and anywhere to perform space design with ease as far as the user operates on a computer accessible to a network without necessity of downloading and installing a program which has been required in the conventional system.

According to an aspect of this invention, there are provided a space design aiding method and a system for providing a user with an environment under which the user implements space design on a computer accessible to a server computer via a network. The system is so configured that a layout design program for implementing a space design of a layout in the terms of a 2D image and a 3D display program for displaying the designed space in the terms of a 3D image are activated on a browser screen of the user's computer.

With this configuration, the same environment for enabling space design is provided to a user operating on a computer equipped with a browser as long as the computer is accessible to the server computer via a network.

These and other objects, features and advantages of the present invention will become more apparent upon a reading of the following detailed description and accompanying drawing.

BRIEF DESCRIPTION OF THE DRAWINGS

FIG. 3 is a diagram showing how a layout is created in the system;

FIGS. 5A and 5B are diagrams showing a procedure of display a space designed with respect to a layout in the terms of a 3D image, wherein FIG. 5A shows an example of a layout in the terms of a 2D image, and FIG. 5B shows an example of the layout displayed in the terms of a 3D image;

FIGS. 9A to 9D are diagrams showing a layout design of a three-stored house, wherein FIG. 9A is a display image showing a layout of a first floor of the house, FIG. 9B is a display image showing a layout of a second floor of the house, FIG. 9C is a display image showing a case that a living and dining room corresponding to an area of 12.0 tatami mats is arranged on the second floor as an object representing a room, and FIG. 9D is a display image showing a third floor of the house;

FIGS. 10A to 10E are diagrams showing a layout design for the case where stairs are provided, wherein FIG. 10A is a display image showing a layout of a first floor (lower floor) of the house, FIG. 10B is a display image showing a layout of a second floor (middle floor) of the house, FIG. 10C is a display image showing placement of stairs for linking the second floor and a third floor (upper floor) over stairs for linking the second floor and the first floor in a superimposed manner, FIG. 10D is a display image asking verification as to whether an automatic linking function of stairs is to be executed, and FIG. 10E is a display image showing the stairs for linking the first floor and the second floor and the stairs for linking the second floor and the third floor are linked by the automatic linking function;

FIGS. 11A to 11D are diagrams showing procedures of depicting a site having a rectangular shape on a display screen;

FIGS. 12A to 12D are diagrams showing procedures of depicting a site having a non-rectangular shape on a display screen;

FIGS. 13A and 13B are diagrams showing selection labels for changing over display of layout between before reforming and after reforming, wherein FIG. 13A shows a state that the label "BEFORE REFORMING" is turned on, and FIG. 13B shows a state that the label "AFTER REFORMING" is turned on;

FIGS. 28A and 28B are diagrams illustrating cases that a prospective lessee searches for a rental housing, wherein FIG. 28A shows a display image of requirements input by the prospective lessee, and FIG. 28B shows a display image of a list of housing information which meet the requirements;

FIGS. 31 to 31C are diagrams illustrating a case that a rental housing is a rental office in a building, wherein FIG. 31C is a display image of simulating how the office looks like in an actual use;

FIG. 35 is a diagram showing information flows as to how a user modifies a layout designed by the seventh system.

DETAILED DESCRIPTION OF THE PREFERRED EMBODIMENTS OF THE INVENTION

Figure 1:
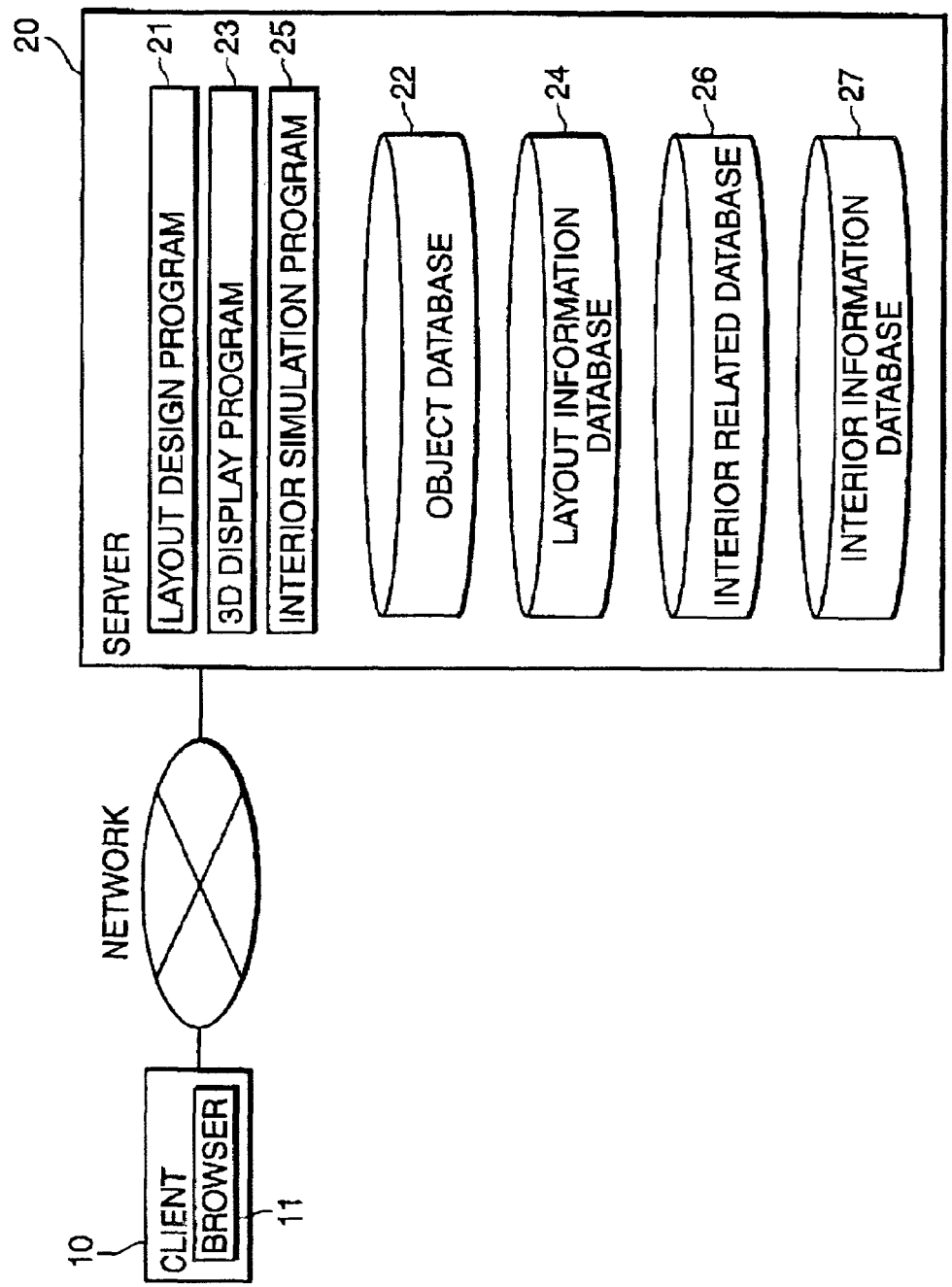
FIG. 1 is a schematic diagram showing a configuration of a space design aiding system using a network according to a first embodiment of this invention.

FIG. 1 is a schematic disarm showing an entire configuration of space design aiding system using a network according to a first embodiment of the invention. A client computer 10 and a server computer 20 are linked via a network such as the Internet. The client computer 10 includes a personal computer loaded with a browser or internet browsing program 11.

The server computer 20 comprises a layout design program 21 for implementing space design of a layout in a house in the terms of a 2D image, an object database 22 which stores retrievable data relating to objects for space design, a 3D display program 23 for displaying a designed space in the terms of a 3D image, a layout information database 24 which stores information relating to a designed space, an interior simulation program 25 for displaying images of interior of a house such as interior commodity including furniture in combination with a designed 3D space for interior simulation, an interior-related object database 26 which stores retrievable data relating to interior of a house including interior commodity for interior simulation, and an interior information database 27 which stores information for specifying interior-related object data selected for the interior simulation.

These programs 21, 23, 25 are configured as a program which is operable on a display screen activated by the browser 11 of the client computer 10 in accordance with functions of the browser 11. For example, these programs are written in the language of JAVA applet, JAVA script and HTML. Note that JAVA is a trademark of Sun Microsystems, Inc. (U.S.A.).

These programs 21, 23, 25 stored in the server computer 20 are transmittable to the client computer 10 in response to a request from the browser 11 of the client computer 10 as one of procedures for space design in the inventive system which is described later, and are operable on the browser screen of the client computer 10 to perform a given operation.

The object database 22 and the interior-related object database 26 are functioned to transmit necessary data to the layout design program 21 and the interior simulation program 25 upon request therefrom. These programs 21 and 25 are operable on the browser screen of the client computer 10.

The layout information database 24 and the interior information database 27 are functioned to store data created in accordance with the layout design program 21 and the interior simulation program 25 on the screen upon request therefrom, and transmit data to the client computer 10 activated with the programs 21 and 25 according to needs.

Hereinafter, procedures of aiding space design according to the system having the above configuration will be described.

When a user wishes to implement space design of a layout in a house, the user activates the browser 11 of the client computer 10 to access the URL of the server computer 20 so as to reach the website or homepage where provided is an environment for enabling the user to perform space design of a layout in a house. Upon reaching the website, the layout design program 21 is automatically transmitted from the server computer 20 to the browser 11 of the client computer 10, whereby the layout design program 21 is executable on the browser screen of the client computer 10.

Specifically, the layout design program 21 is functioned to display 2D images for layout design on the browser screen on a monitor of the client computer 10. Performing designated operations on the monitor screen enables the user to be ready for initiating layout design.

Figure 2:
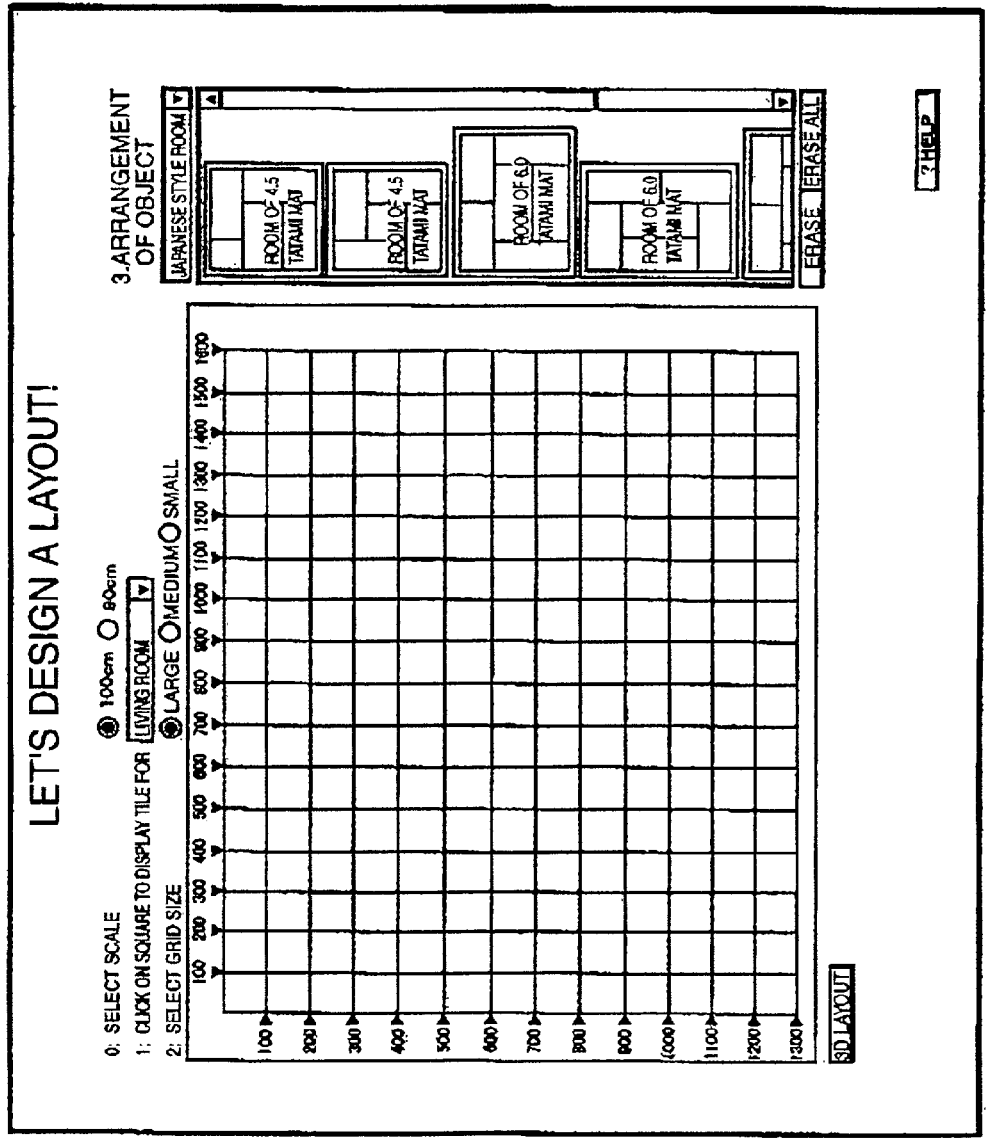
FIG. 2 is a display image for implementing a space design in the system.

FIG. 2 is a diagram showing an exemplified display image of layout design. On a left side in FIG. 2, a region within which a plan view is executable is defined by a certain number of grid lines disposed equidistant in horizontal and vertical directions. A user creates a desired layout in the region.

As a method of creating a layout, a technique of configuring a room by displaying a certain number squares or grids inversely and a technique of arranging an object representing the room are combined. The layout design program 21 has a function of implementing these techniques in combination.

According to the technique of configuring a room by inversely displaying squares, first, a scale displayed in terms of a series of black triangles arrayed at an equidistance is selected. In FIG. 2, a scale in which an interval between the adjacent triangles corresponds to 100 cm is used. Next, what is to be created on a designated square is selected when the user clicks on the given square with a mouse. In the example, tile for living room is selected as a floor material. The for corridor, flooring, carpet, etc. can be selected. When the user clicks on the designated square with a mouse, the selected floor material is displayed on the designated square. Next, a grid size is selected. In the example, "LARGE" grid size is selected. Selecting "MEDIUM" or "SMALL" grid size enables to display a larger number of grids, thereby enabling the user to designate floor material with respect to smaller square areas.

According to the technique of arranging an object representing the room in the terms of a 2D image, first, an object is selected from an object selecting section on a right side on the display screen. In the example, "Japanese style room" is selected, and "room of 4.5-tatami-mat", "room of 6.0-tatami-mat", etc. are displayed as objects. Objects other than the room such as sink, toilet, bathroom, veranda, door, window, and closet are selectable. The user is enabled to arrange objects in the room in the terms of a 2D image by dragging and dropping these objects with a mouse.

These objects are derived from object data stored in the object database 22 of the server computer 20. When the user selects the objects from the object selecting section, the layout design program 21 which is being activated on the browser screen of the client computer 10 is functioned to access the server computer 20 each time the object is selected to request for object data, thereby enabling the user to download the object data from the object database 22. All the object data may be downloaded from the server computer 20 at the time of starting up the layout design program 21 for storage in the client computer 10. Alternatively, the object data may be downloaded one by one under the condition that the layout design program 21 is being activated and the communications line is not busy.

Next, a manner as to how a layout is created is described with reference to FIG. 3. In FIG. 3, a rectangular region covering 100 to 400 in a vertical coordinate and 100 to 600 in a horizontal coordinate is displayed in halftone. This region is obtained by inversely displaying 15 squares (=3 squares in vertical direction×5 squares in horizontal direction) by clicking the squares one by one with a mouse. The halftone region represents that tiles for living room are laid on the region. Thus, a region for a living room is secured. In the case where the user wishes to narrow the region for the living room, the user clicks on the halftone square(s) with a mouse again to return the designated square(s) into the original state.

In the object selecting section shown in FIG. 3, "Japanese style room" is selected. Accordingly, various objects for "Japanese style room" are displayed in an object display section which is displayed below the object selecting section in FIGS. 2 and 3. In FIG. 3, a room of 4.5-tatami-mat is arranged next to the living room by selecting the room of 4.5-tatami-mat by means of dragging and dropping with a mouse. In the case where the user wishes to replace the selected room of 4.5-tatami-mat with a room of 6.0-tatami-mat, the user clicks on the ERASE button in FIG. 2 to erase the object of 4.5-tatami-mat which has been displayed below the living room, and selects the object of 6.0-tatami-mat from the object display section by dragging and dropping with a mouse to replace the object. Objects such as toilet, bathroom, veranda, door, window, and closet can be arranged in a similar manner as mentioned above. In the case where the user wishes to erase all the objects and rearrange objects from the beginning, the user manipulates on the "ERASE ALL" button in FIG. 2. In the case where the user does not know how to operate the buttons, the user manipulates the "HELP" button in FIG. 2.

Figure 4:
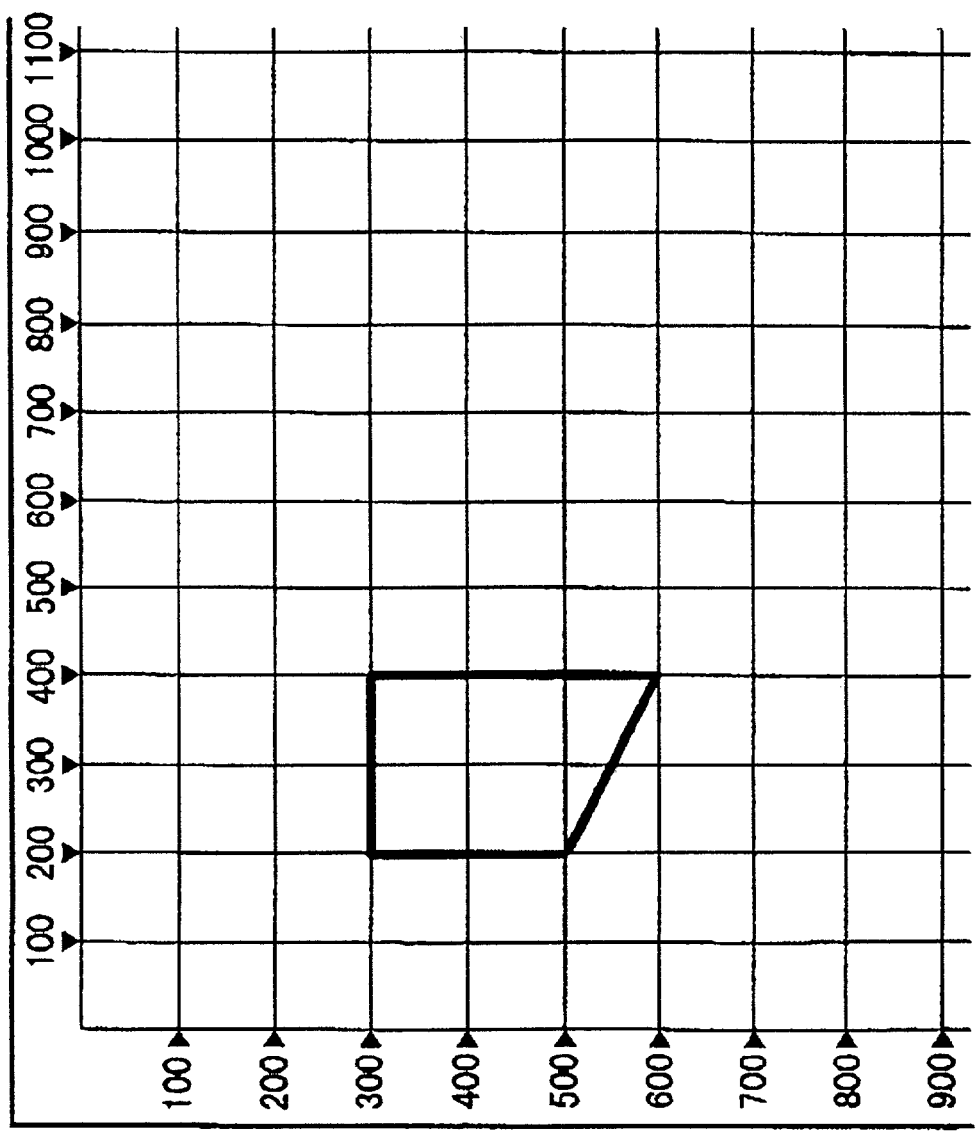
FIG. 4 is a diagram showing how a layout of a non-rectangular shape is drawn.

As a technique for creating a layout, there is a technique of creating a room of a non-rectangular shape by depicting an outline of a room by tracing prescribed grid lines or plotting out cross-points of grid lines on the plan view. The layout design program 21 has a function of implementing this technique. Specifically, as shown in FIG. 4, tracing a grid line with a mouse or clicking on the cross-point of a grid line enables the user to create a room of a non-rectangular shape. This technique provides user-friendly design operation. This technique is advantageous in that designing of objects is not required even in the case where the user wishes to create a room of a different shape other than what has been created, thus reducing costs required for system modification.

The aforementioned techniques are used alone or in combination according to needs to make a room or a facility in the layout design. These rooms and facilities are designed as a closed space. The type of a room or a facility is designated with respect to each closed space. The type is designated by selecting on the display menu, as mentioned above. In the case where there is a new type which is not available on the menu, the new type is inputted in an identifiable name.

Next, various procedures for displaying a space designed with respect to a layout in the terms of a 3D image is described with reference to FIGS. 5A through 13.

Figure 5A:
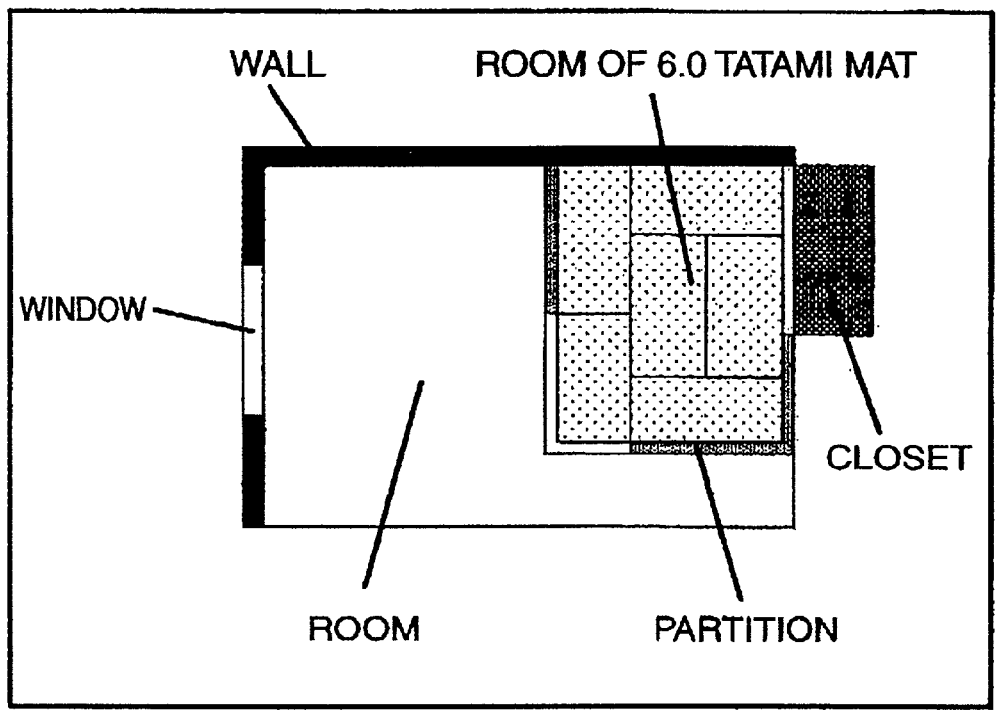
Figure 5B:
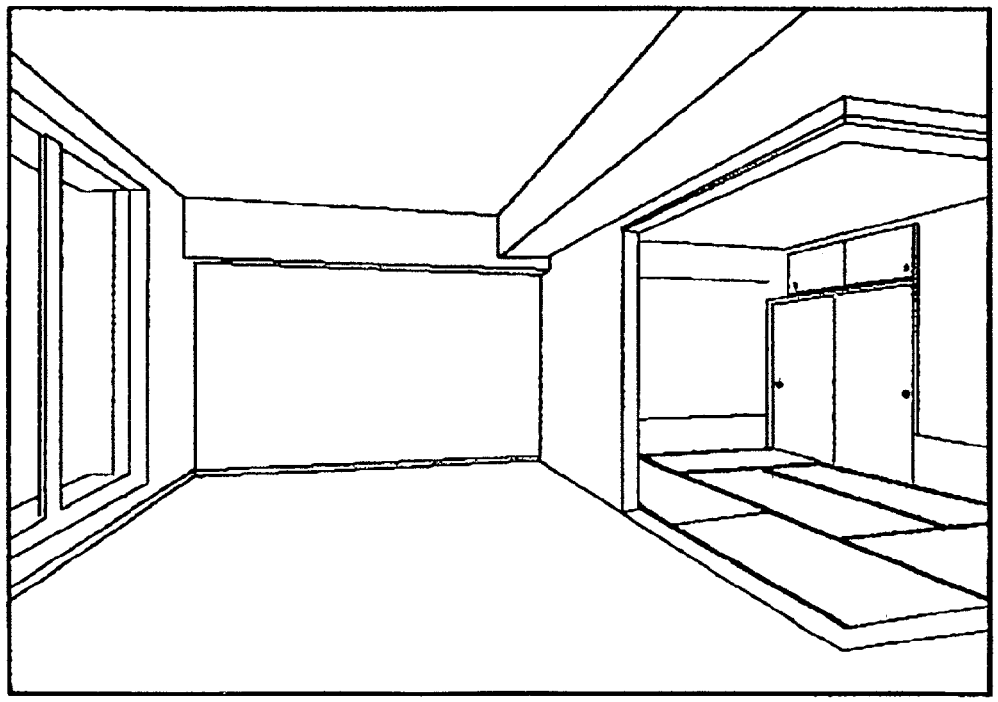

Let it be assumed that a layout design as shown in FIG. 5A has been made. In this state, when the user clicks on the "3D LAYOUT" button in FIG. 2 with a mouse, a request for 3D display is sent to the server computer 20 from the layout design program 21 which is being activated on the browser screen of the client computer 10. Upon receiving the request for 3D display, the server computer 20 transmits the 3D display program 23 to the browser 11 of the client computer 10 automatically to start up the 3D display program 23 on the browser screen of the client computer 10. Then, the 3D display program 23 causes the layout which has been created with use of the layout design program 21 based on the plan view to be displayed in the terms of a 3D image on the browser screen of the client computer 10 as shown in FIG. 5B by transforming a plan view figure into a 3D image. The 3D display program 23 has a function of transforming a 2D image into a 3D image to display a space designed with respect to a layout on a plan view in the terms of a 3D image. When the space of the layout is displayed in the terms of a 3D image, the user is enabled to accurately and intuitively grasp the space of the designed layout.

The 3D display program 23 may merely have a function of display data for 3D display on the monitor of the client computer 10, while the server computer 20 having a function of transforming a space of the layout designed in the terms of a 2D image into 3D images. In this case, information regarding the space of the layout designed with use of the layout design program 21 is temporarily transmitted from the client computer 10 to the server computer 20 via a network. Simultaneously, data which has been converted into a 3D image by the 3D transforming function of the server computer 20 is transmitted from the server computer 20 to the client computer 10 to display the 3D image on the browser screen of the client computer 10 by the 3D display program 23 operable on the browser screen of the client computer 10. This altered configuration allows the server computer 20 which generally has a high performance of computation to perform 3D transformation, thereby reducing the burden to be processed by the client computer 10.

When an image is displayed in the terms of a 3D image, various demands such as adjusting the position of a window or its height are raised. To satisfy such demands, the 3D display program 23 has a function of modifying the designed space of the layout on the 3D display screen.

Figure 6:
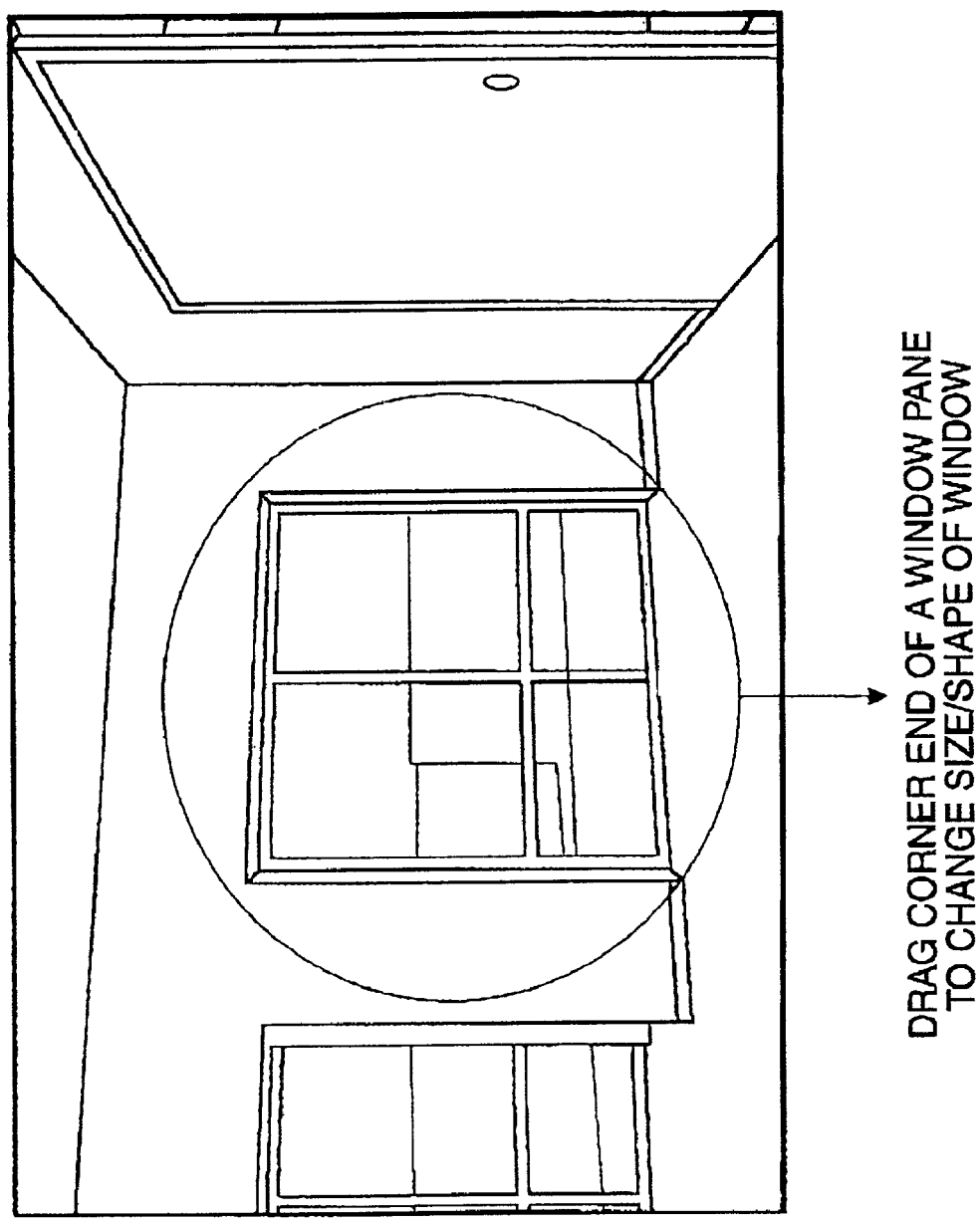
FIG. 6 is a diagram showing how space information of a designed layout is changed in the state of 3D image.

More specifically, in the case where the user wishes to adjust the position of a window or its height, as shown in FIG. 6, selecting a window pane with a mouse and dragging a corner end thereof enables the user to correct the information regarding the space designed with respect to the layout a the terms of a 3D image.

When the designed layout is modified with use of the 3D display program 23, the layout design program 21 is functioned to display a space of the modified layout in the terms of a 2D image in association with the modification. Thus, the modification in terms of 3D display is maintained even if the user returns to a screen displaying a plan view figure after the modification.

The above technique of modifying space design on the 3D display screen is effective in the case where input of information regarding the height is necessary. It is the general practice in 2D design to add information regarding height with respect to a drawing of plan view. In this case, height information is input based on designer's imagination before implementing an actual 3D image display. Direct inputting in a 3D space as shown in FIG. 6 enables a user to input height information intuitively, which is feasibly operable even for a user who is not familiar with CAD operation.

Generally, CAD systems are configured for experts, and accordingly, manipulations thereof are complicated. Even if there is a CAD system designed for general users, many detailed settings are required in view of the fact that the system aims at realizing design of construction. Accordingly, there has not been provided a system environment which enables general users to design and review with ease. In particular, regarding a tool of creating 3D space data about a layout of a house operable on a network, a known multipurpose CAD system has been utilized, and operations have been made to "reduce weight" of the system to such a level as to make the system executable in network communications. Only experts can implement such operations, which takes time and money. On the other hand, the system of this invention enables even a user without expertise to easily create 3D space data about a layout in a house on a network with a low cost.

Figure 7:
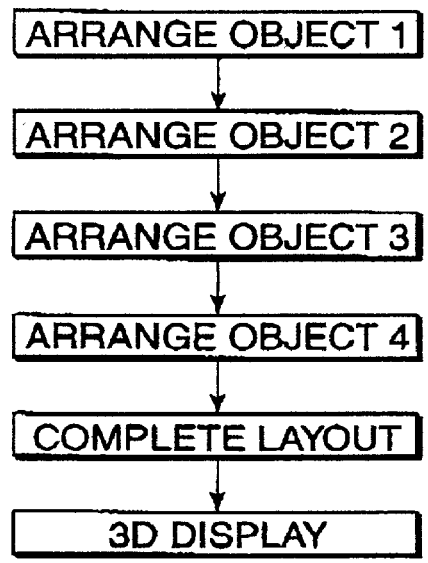
FIG. 7 is a diagram showing a flow for displaying a layout in the terms of a 3D image after the layout is completed.
Figure 8:
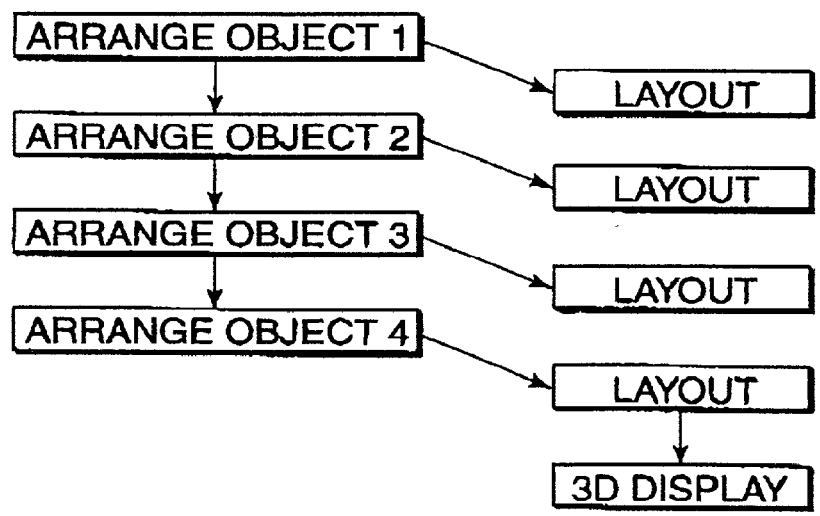
FIG. 8 is a diagram showing a flow for displaying a state of layout in the terms of a 3D image each time one object is arranged on a plan view.

In the foregoing section, space design is performed by arranging a plurality of objects in the terms of a 2D image to create a layout, and displaying these objects in the terms of a 3D image, as shown in FIG. 7. Alternatively, as shown in FIG. 8, a layout state may be displayed in the terms of a 3D image each time an object is arranged in the terms of a 2D image. The technique of displaying 3D images each time an object for a layout is arranged, as shown in FIG. 8 is advantageous in that general users who are not familiar with display in the terms of a 2D image can easily grasp a procedure of completing the layout. The latter technique (see FIG. 8), however, has the following drawback, although such a drawback is negligible as far as the number of objects is small. As the number of objects increases, operating performance of a computer may be slow due to a status of memory utilization or limited computer power.

On the other hand, the former technique eliminates 3D image display which is instantaneously required each time an object is arranged. Accordingly, 3D image data can be created in the terms of a 2D image by utilizing a time, which is required for 3D image display in the latter technique, and 3D display with respect to all the arranged objects can be performed immediately after the last object is arranged. This technique is advantageous in that the user feels stand-by time short. Also, this technique does not need simultaneous display of plan view or 2D image and a perspective view (3D image) drawing. Accordingly, a large screen area is usable, and a program having enhanced operability can be configured. Also, this technique is advantageous in that the number of accesses to the server computer can be lessened to thereby suppress occurrence of communications trouble.

In the foregoing section, layout creation with respect to the first floor of a house in the terms of a 2D image has been described. In the case where two or more floors are provided such as two- or three-stored houses and apartments including so-called "maisonette", designing has to be implemented, considering layout of each floor and a positional relation between a lower floor and an upper floor.

In view of the above, the layout design program 21 has a function of perspectively displaying a layout of an upper floor over a layout of a lower floor in a superimposed manner based on a plan view of the upper floor to which the layout design is being implemented.

Specifically, FIG. 9A is a diagram showing a display image of a layout on a first floor being designed. A room (8.0 room) corresponding to 8.0-tatami-mat and a Japanese style room (8.0 J-room) corresponding to 8.0-tatami-mat are arranged in a plan view. Hereinafter, numerical value prefixed to a room indicates the number of tatami-mats corresponding to the area of the room, and J-room indicates a Japanese style room. In this state, characters "1F" of a floor selection label provided at a lower right end corner in FIG.

9A are displayed inversely, and an object representing a room on the first floor is displayed in a color.

Next, when a user clicks on a portion displayed as "2F" of a floor selection label, characters "2F" are displayed inversely, as shown in FIG. 9B, whereby the display image is changed to an image for designing layout of a second floor in the terms of a 2D image. At this time, the objects (8.0 room and 8.0 J-room) which have been arranged in the layout design of the first floor are displayed at a high value in lightness in terms of monochromatic image display. Displaying the object with such a high lightness provides the user with a feeling as if he/she sees the layout of the first floor down through the second floor to grasp the layout of the first (lower) floor simultaneously with the second floor. Thus, the user can proceed with space design of a layout of the second (upper) floor considering its correlation to the first (lower) floor. For example, in FIG. 9C, a living and dining room (12.0 LD) is arranged as an object representing a room on the second floor. The living room can be arranged taking into account its positional relation with the 8.0 room and the 8.0 J-room on the first floor.

At this time, an object (12.0 LD) representing a room on the second floor is displayed in a color (halftone in FIG. 9C). Accordingly, the user can freely change the position or orientation of the object by dragging operation with a mouse in the terms of a 2D image. Further, the user can delete the object displayed in a color or replace the object with a new one. During designing of the layout on the upper floor (in this case, second floor), editing operation such as moving, rotating, deforming, deleting, and replacing is banned with respect to the objects (8.0 room and 8.0 J-room) representing the rooms on the lower floor (in this case, first floor) which are displayed at a high lightness in terms of a monochromatic image display.

In the case where the user wants to modify the layout of the lower floor, the user clicks on the portion displayed as "1F" of the floor selection label provided at the lower right end corner in FIG. 9C. Then, the display image is returned to the state shown in FIG. 9A, whereby the user is enabled to perform editing such as moving, rotating, deforming, deleting, and replacing.

In the case where the user performs a layout design of a third floor after completing designing of the layout of the first and second floors, the user clicks on the portion indicated as "3F" of a floor selection label provided at the lower right end corner in the drawing, whereby the display image is changed to a state shown in FIG. 9D. In this state, the characters "3F" is displayed inversely to indicate that the plan view of FIG. 9D is a display image for designing a layout of the third floor. The object (12.0 LD) arranged on the plan view at the time of layout design of the second floor is displayed at a high lightness in terms of a monochromatic image display. In this state, prohibited is an editing operation of the object representing a room on the lower floor which arc displayed at a high lightness in terms of a monochromatic image display. Thus, since new objects arranged by the user are displayed in a color, the user can identify the object belonging to the layout of the floor to which the designing is being implemented Further, while the display image indicating edition of the layout of the third floor is turned on, merely the layout of the floor right below the third floor (i.e., second floor) is displayed at a high lightness without displaying the layout of the floor one step further down below the third floor (i.e., first floor).

Furthermore, in the case where a layout of a housing provided with a plurality of floors is to be designed, stairs to link the lower floor and the upper floor are required to be provided.

Therefore, the layout design program 21 has a function of automatically arranging stairs at a position of a floor in correspondence to the position of the stairs on a floor on one level up or down the floor in the case where stairs are selected as an object representing a room and arranged on a plan view of the upper floor or the lower floor.

Specifically, the space indicated by LD in FIG. 10A represents a living room on the first floor, and object arranged at an upper left corner of the living room represents stairs. When the layout of the second floor is displayed with use of the aforementioned floor selection label as shown in FIG. 10B, the object representing the living room on the first floor is displayed with a high value in lightness in terms of a monochromatic image display with an outline thereof depicted with a solid line. Simultaneously, an object representing the stairs provided on the first floor are displayed as what the object would look like from the second floor. In this example, an occupy area of an object representing an opening (inlet or outlet) of the stairs and the stairs are changed between FIGS. 10A and 10B. While the opening of the stairs is on the lower right side in FIG. 10A, the opening of the stairs is on the lower left side in FIG. 10B. In other words, the opening of the stairs in FIG. 10A represents a lowermost ascending step from the first floor to the second floor, and the opening of the stairs in FIG. 10B represents an uppermost descending step from the second floor to the first floor.

Furthermore, in the case where a layout of a housing having 3 or more floors (including ground floor) is to be designed, there is a case that stairs for linking the upper floor and the middle floor and stairs for linking the middle floor and the lower floor are continuously arranged at the same position in vertical orientation.

In view of the above, the layout design program 21 has a function of automatically linking the stairs on a plan view representing the middle floor when designing a layout of the middle floor in the case where there arc stairs for linking the middle floor and the upper floor and stairs for linking the middle floor and the lower floor.

Specifically, as shown in FIG. 10C, in the case where the user attempts to display the stairs for linking the second floor (middle floor) and the third floor (upper floor) in a superimposed manner over the stairs for linking the second floor (middle floor) and the first floor (lower floor) at the same position on the display image of designing a layout of the second floor (middle floor) as shown in FIG. 10B, a function of automatically linking and displaying stairs is activated, and a display image of asking the user for verification such as a message "LINK STAIRS?" is displayed. When the user clicks OK on the verification screen with a mouse, as shown in FIG. 10E, the stairs from the first floor to the second floor and the stairs from the second floor to the third floor are jointly displayed. Thereby, a first descending step from the second floor to the first floor is displayed on the lower left end of the stairs on the plan view of the second floor, whereas a first ascending step from the second floor to the third floor is displayed on the lower right end of the stairs on the plan view of the second floor. More specifically, the object representing the stairs in FIG. 10E is such that a right half region thereof represents the stairs from the second floor to the third floor and a left half region thereof represents the stairs from the second floor to the first floor. In this way, since the layout design program 21 has the function of automatically linking and displaying stairs, stairs can be continuously arranged from the first floor to the second floor, and from the second floor to the third floor. In this arrangement, when the user clicks on "CANCEL" button on the verification screen in FIG. 10D, activation of automatic linking function is banned. In this case, the stairs for linking the second floor and the first floor and the stairs for linking the second floor and the third floor can be arranged at different positions with respect to the floors, individually.

In the case of two- or more stored- house, dimensions, shape, and orientation of a site for the house are important elements in layout design so as to construct the house in conformance with a construction regulation to be applied to the site.

In view of the above, the layout design program 21 has a function of determining a site based on which 3D layout design is implemented.

Figure 12C:
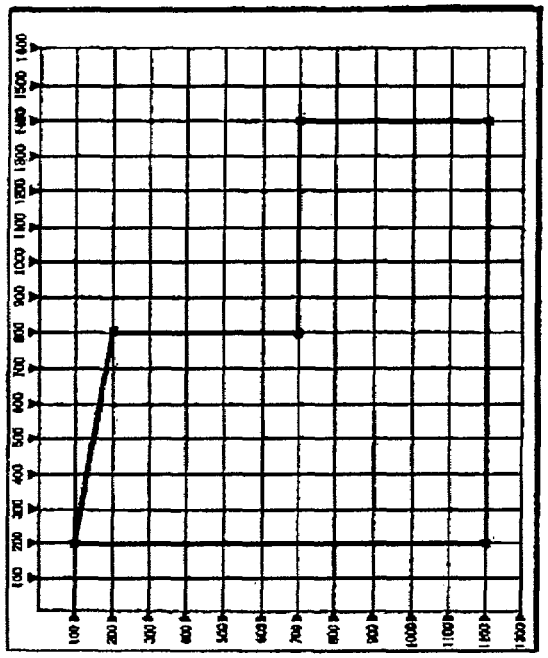
Figure 12B:
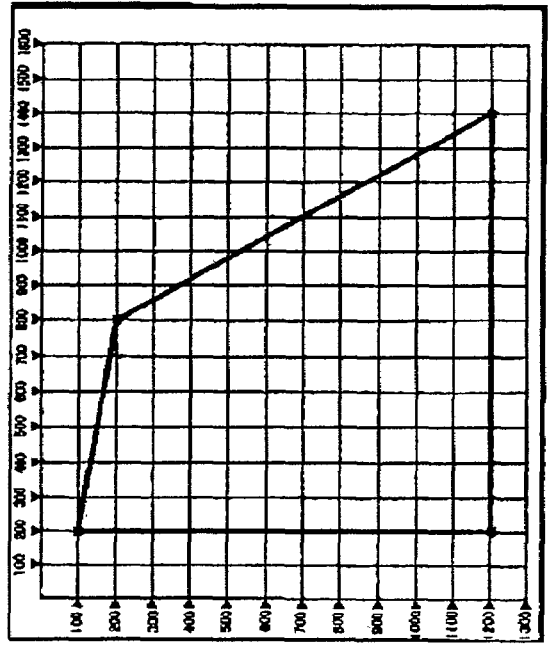

FIGS. 11A to 11C are diagrams illustrating how a site of a rectangular shape is determined, and FIGS. 12A to 12C are diagrams illustrating how a site of a non-rectangular shape is determined. "DESIGN SITE" and "DETERMINE" buttons shown in these drawings are provided on a display image operable by the layout design program 21 (e.g., display image of FIG. 2).

In the case where a site of a rectangular shape is determined, the user clicks on the "DESIGN SITE" button with a mouse, as shown in FIG. 11A. Then, a display image on which the user inputs width (unit: mm) and depth (unit: mm) of the site is displayed, as shown in FIG. 11B. When the user inputs a numerical value with respect to the width and the depth, the area of the site is computed and displayed in terms of square meters. When the user presses the "CREATE" button shown in FIG. 11B, a display image in which an outline of the site is depicted with a red frame (old line in FIG. 11C) is displayed on a plan view, as shown in FIG. 11C. When the user presses the "DETERMINE" button shown in FIG. 11D in this state, the outside and the inside of the site are displayed with different colors. Thereby, arranging objects for layout design outside the site is banned.

In the case where a site of a non-rectangular shape is determined, the following operation is implemented. When the user clicks on the "DESIGN SITE" button in FIG. 12A with a mouse, an initial display image is displayed in which apices respectively representing four corners of a site are displayed and the adjacent apices are linked with a red line, as shown in, e.g., FIG. 11C. When the user drags, e.g., the upper right corner (apex) with a mouse to such a state as shown in FIG. 12B, a site of a non-rectangular shape can be designed. Further, when the user adds an apex for the site by clicking on the right portion of the mouse or with a menu, and changes the shape of the site by dragging with the mouse, as shown in, e.g., FIG. 12C, the user can design a site of any desired configuration. Then, when the user presses the "DETERMINE" button in FIG. 12D, the outside and the inside of the site are displayed in different colors. Thereby, arranging objects for layout design outside the site is banned.

Alternatively, a rough outline of the site is determined by the technique shown in FIGS. 11A to 11D, and details of the site are determined by the technique shown in FIGS. 12A to 12D.

The information regarding the space with respect to which a layout has been designed can be stored in the layout information database 24 of the server computer 20 by the layout design program 21.

Specifically, there is a "STORAGE" button (not shown) on the display image for layout design. When the user clicks on the "STORAGE" button or its equivalent to input command of storage, the layout design program 21 is functioned to store information regarding the layout that has been created in the layout information database 24 of the server computer 20 by automatically allocating an address thereto. At this time, a number identifying the designed layout is transmitted to the client computer 10 for storage on the side of the user. The user then downloads the layout information based on the design number from the layout information database 24 of the server computer 20 by utilizing a call-out function (function of opening an existing file) of the layout design program 21. Thus, the user is enabled to carry on the layout design such as modification of the layout which has been designed before.

In the case where the website has a configuration which demands the user to input login number, etc. for utilization of the layout design program 21, the system may be configured in such a manner that the design number is automatically allocated to the log-in number, etc. and that the layout information corresponding to the design number is called out next time when the user inputs the log-in number.

Since the layout design program 21 has such a storage function, the user or customer can store layout information which has been reviewed at home, and a person in charge of designing or a salesperson can freely browse the stored layout information for design consultation.

Since the layout design program 21 has such a storage function, the user can call out layout information that has been stored by the other person for design modification and alteration.

Alternatively, the layout information may be stored in the client computer 10.

Figure 13A:
Figure 13B:
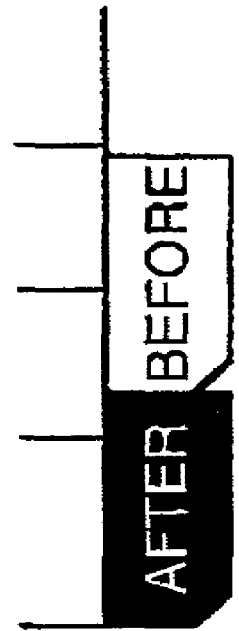

Further, providing an arrangement which enables storing layout information before and after reforming respectively and displaying of designed space before and after the reforming is advantageous because the user can compare the layouts before and after the reforming, thereby feasibly grasping what merits will be obtainable by reforming. For instance, as shown in FIGS. 13A and 13B, labels for selecting display of layout before reforming and display of layout after reforming are provided. When the user clicks on the "BEFORE REFORMING" label, the characters "BEFORE REFORMING" are displayed inversely as shown in FIG. 13A, whereby a layout before reforming is displayed in the terms of a 2D image. Similarly, when the user clicks on the "AFTER REFORMING" label, the characters "AFTER REFORMING" are displayed inversely as shown in FIG. 13B, whereby a layout after reforming is displayed in the terms of a 2D image.

Further, when the user utilizes the perspective (3D) display function of the lower floor as described in FIGS. 9A to 9D and sets the layout of the first floor in FIG. 9A as the layout before reforming, while setting the layout of the second floor in FIGS. 9B and 9C as the layout after reforming, the user can create images of the rooms (current rooms) before reforming at first, and then create images of the rooms after reforming over the images of the current rooms. In other words, according to this configuration, by arranging objects representing the rooms after reforming in color in a superimposed manner over a display image displaying images of the rooms before reforming in a state that an outline of objects representing the rooms before reforming is displayed with a high lightness in terms of a monochromatic image display, the user can create the images of the rooms after reforming while grasping the images of the rooms before reforming.

Further, simulation as to how furniture is to be arranged or how the interior looks like is demanded with respect to the created layout information. In view of the above, the system of this invention is provided with the interior simulation program 25 which implements interior simulation by jointly displaying interior images such as interior commodity including furniture in the space designed with respect to a layout.

When the user clicks on the start button or the like (not shown) to execute interior simulation on the layout design screen shown in, e.g., FIG. 2, request for interior simulation is sent from the layout design program 21 which is being activated by the browser 11 of the client computer 10 to the server computer 20. Upon receiving the request, the server computer 20 automatically transmits the interior simulation program 25 to the browser screen of the client computer 10. Then, the interior simulation program 25 is activated on the browser 11 of the client computer 10. The interior simulation program 25 realizes interior simulation by utilizing a 3D space displaying function of the 3D display program 23 and jointly displaying interior images on the 3D display screen.

Interior-related object data such as images of interior commodity to be utilized by the interior simulation program 25 are stored in the interior-related object database 26 and is readout therefrom and utilized upon request from the interior simulation program 25.

Figure 14:
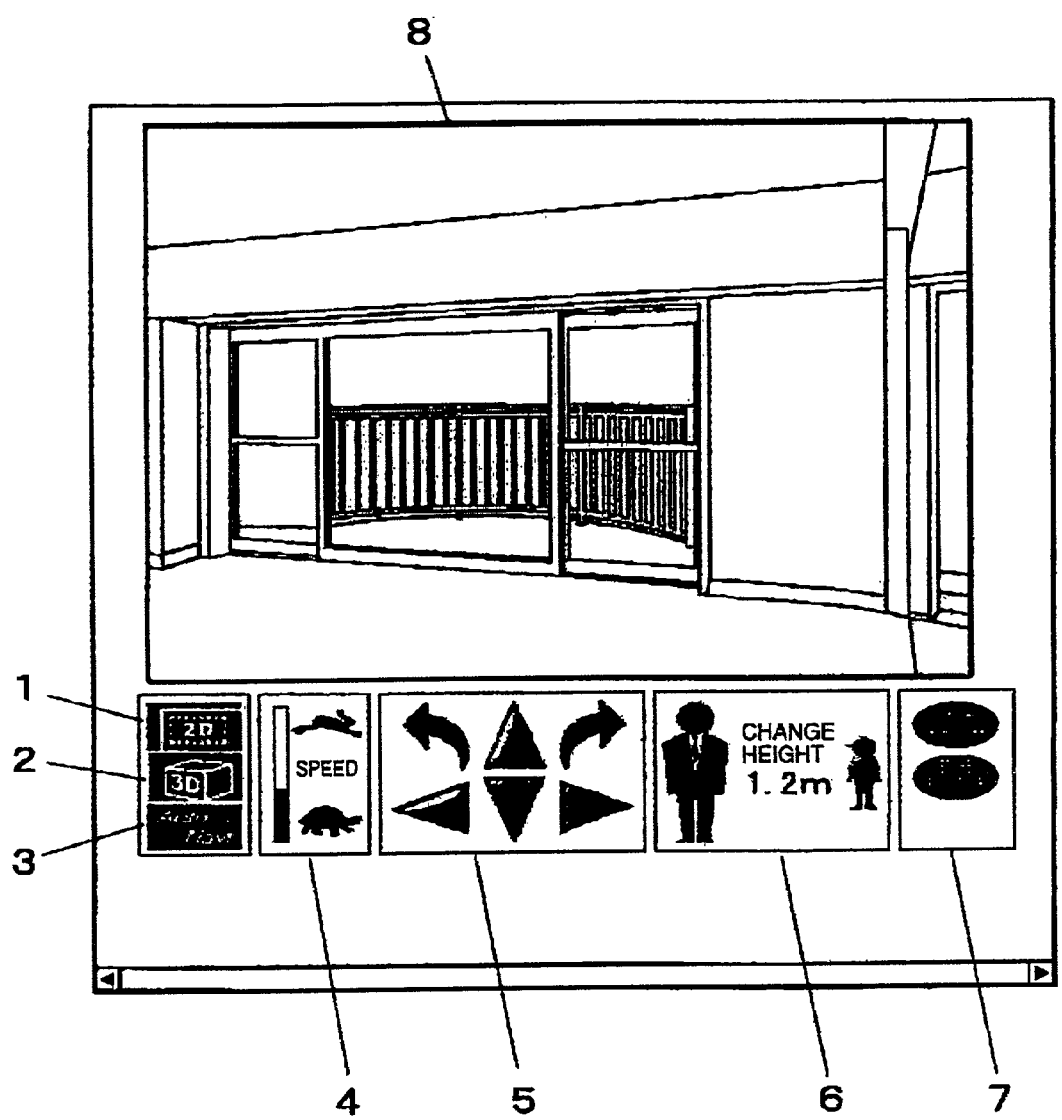
FIG. 14 is a diagram showing a display image implemented by an interior simulator program in the system.
Figure 15:
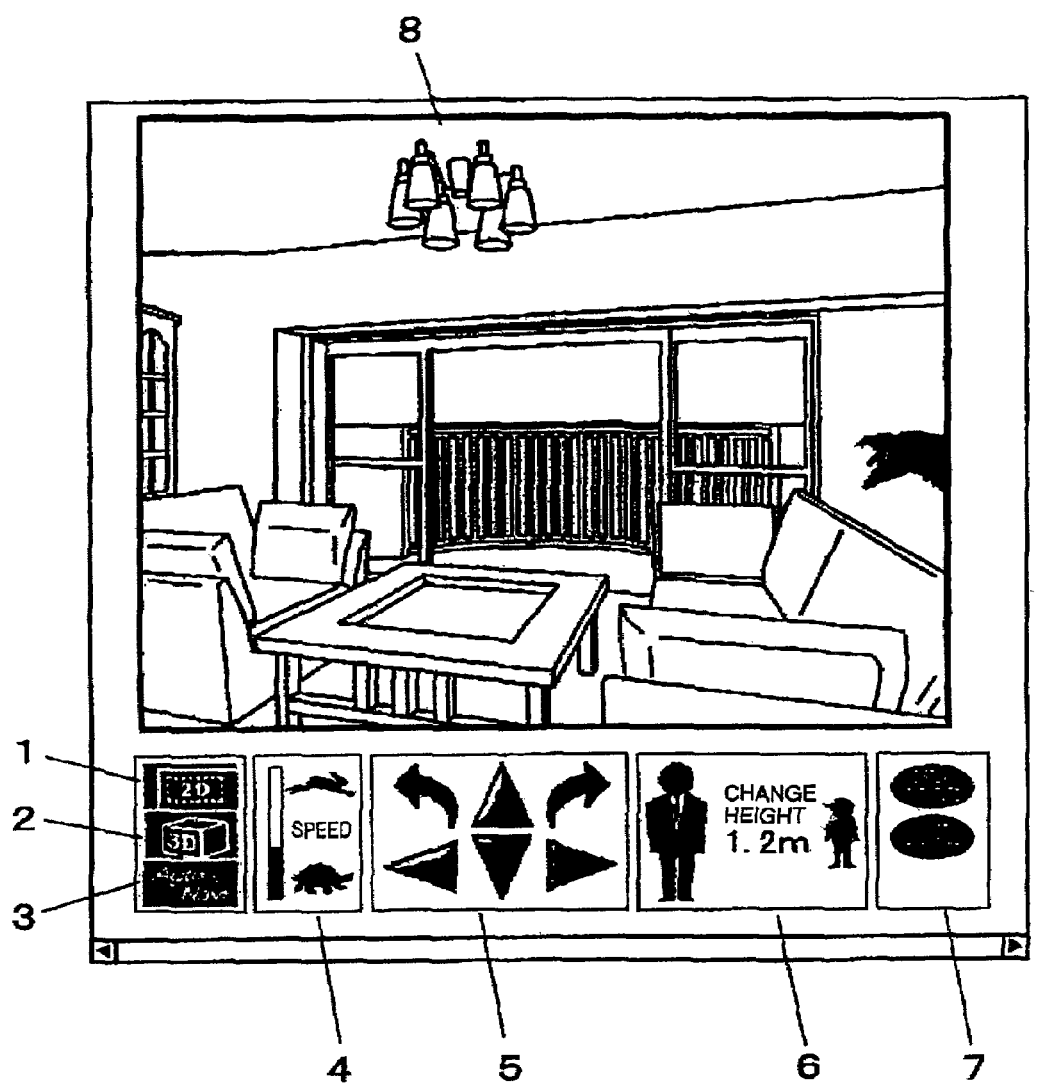
FIG. 15 is a diagram showing another display image implemented by the interior simulator program.
Figure 16:
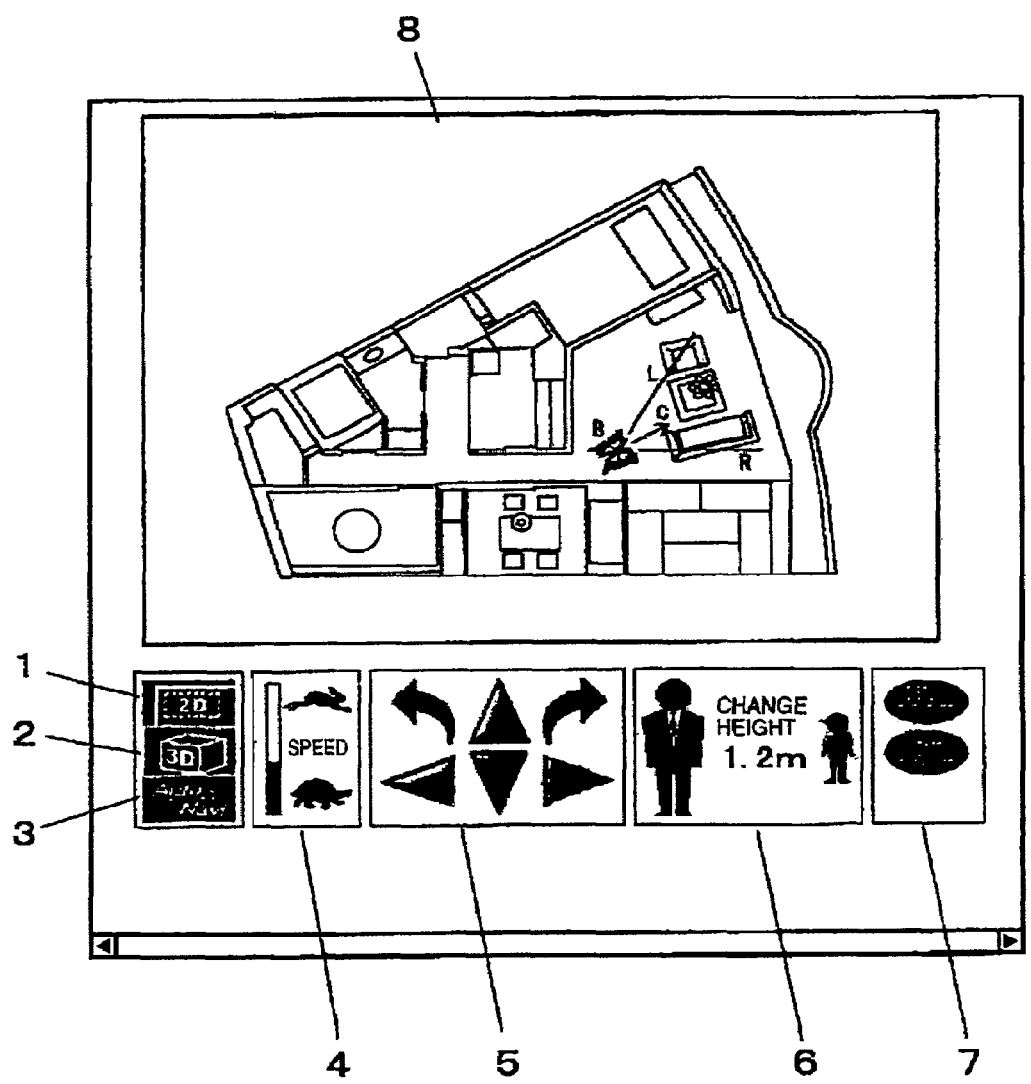
FIG. 16 is a diagram showing still another display image implemented by the interior simulator program in the system.

FIGS. 14 to 16 are diagrams respectively showing exemplary images displayed on the screen by the interior simulation program 25. In the respective drawings, reference numeral 1 denotes a two-dimensional image display button, 2 denotes a three-dimensional image display button, 3 denotes an automatic viewpoint shifting button, 4 denotes a shifting speed setting and displaying section, 5 denotes a manual viewpoint shifting button, 6 denotes a viewpoint up and down button, 7 denotes a furniture display on and off button, and 8 denotes a 2D and 3D image rendering area. These display images are displayed on a browser screen activated by the browser 11 of the client computer 10. Clicking on a viewpoint control menu on manipulating sections 1 to 7 with a mouse cursor enables a user to freely change the viewpoint based on what he/she wants to verify. With this configuration, the user can verify the designing plan from his/her viewpoint depending on activity level of his/her lifestyle. This configuration not only provides the user with an environment feasibly operable for the user not skilled in manipulation of the computer but also prevents an experienced operator from being imparted with unnecessary stress during manipulation of the viewpoint shifting. Thus, the configuration provides an environment that enables the user to concentrate on designing and verification.

First, the manipulating section for changing the height of viewpoint is described. The manipulating section 6 in FIGS. 14 through 16 depicts an image of "ADULT" and "CHILD". Between these two images, the height of current viewpoint is displayed in terms of a numeric value. In this example, pressing the button "ADULT" elevates the viewpoint by 10 cm stepwise. Conversely, pressing the button "CHILD" lowers the viewpoint by 10 cm stepwise. Display of viewpoint height is changed each time the aforementioned operation is conducted.

Next, a manipulating section for changing the viewpoint shifting speed is described. The manipulating section 4 in FIGS. 14 through 16 depicts images of "RABBIT" and "TURTLE". Manipulating a slide bar on the left side of these figures enables to adjust and display the speed of viewpoint shifting. Pressing the button "RABBIT" increases the shifting speed, and pressing the button "TURTLE" decreases the shifting speed, thus implementing speed change stepwise. Manipulating the slide bar enables to continuously change the speed.

Next, a manipulating section for changing over 2D image display and 3D image display is described. Manipulating the 2D button 1 shown in FIG. 14 or 15 enables to display an image in the 2D and 3D image rendering area 8 in the terms of a 2D image as shown in FIG. 16. In FIG. 16, the viewpoint location ill terms of a three-dimensional display is shown by the butterfly mark flying in the virtual space, and the direction of line of sight in terms of a three-dimensional display is shown by the arrow C. The angle of field of view is defined by straight lines L and R. Straight line L denotes the leftmost end of field of view in a three-dimensional display, and straight line R denotes the rightmost end of field of view in a three-dimensional display. Further, manipulating the 3D button 2 in FIG. 16 enables to display an image in the 2D and 3D image rendering area 8 in the terms of a 3D image as shown in FIG. 14 or 15. At this time, the image is displayed in the image rendering area 8 from the viewpoint, in the direction of line of sight, and at the angle of field of view in terms of a 2D display. The viewpoint may be shifted by implementing drag and drop operation with respect to the butterfly mark B, and the direction of line of sight may be changed by dragging the distal end of the arrow C.

Thus, providing the manipulating section for changing over two-dimensional display and three-dimensional display enables to implement the following operation. Pressing the 2D display button after shifting the image in a 3D virtual space enables to present a virtual space represented in a bird's eye view, while displaying a position marker, which is a location at which the viewer virtually stands in the three-dimensional virtual space (butterfly mark B) and orientation in which the viewer venally directs his/her line of sight (arrow C, etc.). This configuration is effective in grasping where the viewer is located with respect to the entire space when virtually moving in the 3D virtual space.

Next, a manipulating section for changing over ON and OFF of furniture display is described. It should be appreciated that fixture is not displayed in a 3D virtual space on the 2D and 3D image rendering area in FIG. 14. Pressing "ARRANGE FURNITURE" button on the manipulating section 7 in the state shown in FIG. 14 enables to change the state to a state of FIG. 15 in which furniture is displayed. Pressing "ERASE FURNITURE" button on the manipulating section 7 changes the state of FIG. 15 to the state of FIG. 14 where furniture is not displayed.

Next, a manipulating section for changing over automatic viewpoint shifting and manual viewpoint shifting is described. The manipulating section 3 in FIGS. 14 through 16 is the section for automatic viewpoint shifting. Pressing "AutoNavi" button in the drawings automatically shifts the viewpoint or navigates the viewer in the space along the designated route on a layout map. The manipulating section 5 in FIGS. 14 through 16 is a section for manual viewpoint shifting. The section 5 includes four triangular-shaped buttons for shifting the viewpoint B forward, backward, rightward, and leftward respectively, and two arrow buttons respectively pointing leftward and rightward in round curves for changing the orientation of line of sight. The arrow buttons correspond to the arrow C. Manipulating one of these buttons suspends automatic viewpoint shifting, and changes over to manual viewpoint shifting.

Figure 17:
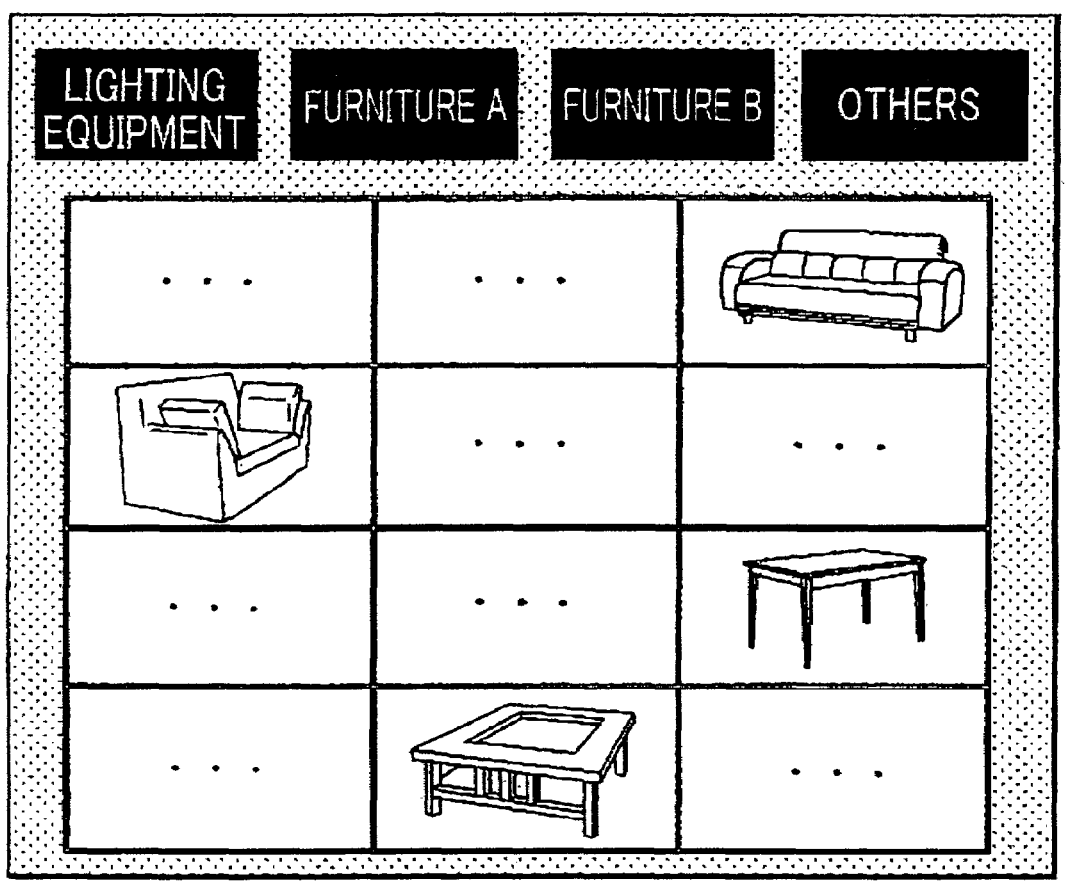
FIG. 17 is a diagram showing a display image of interior-related object data for selection such as interior commodity including furniture which are stored in the interior-related object database of the system and an utilizable by operating the interior simulator program.
Figure 18:
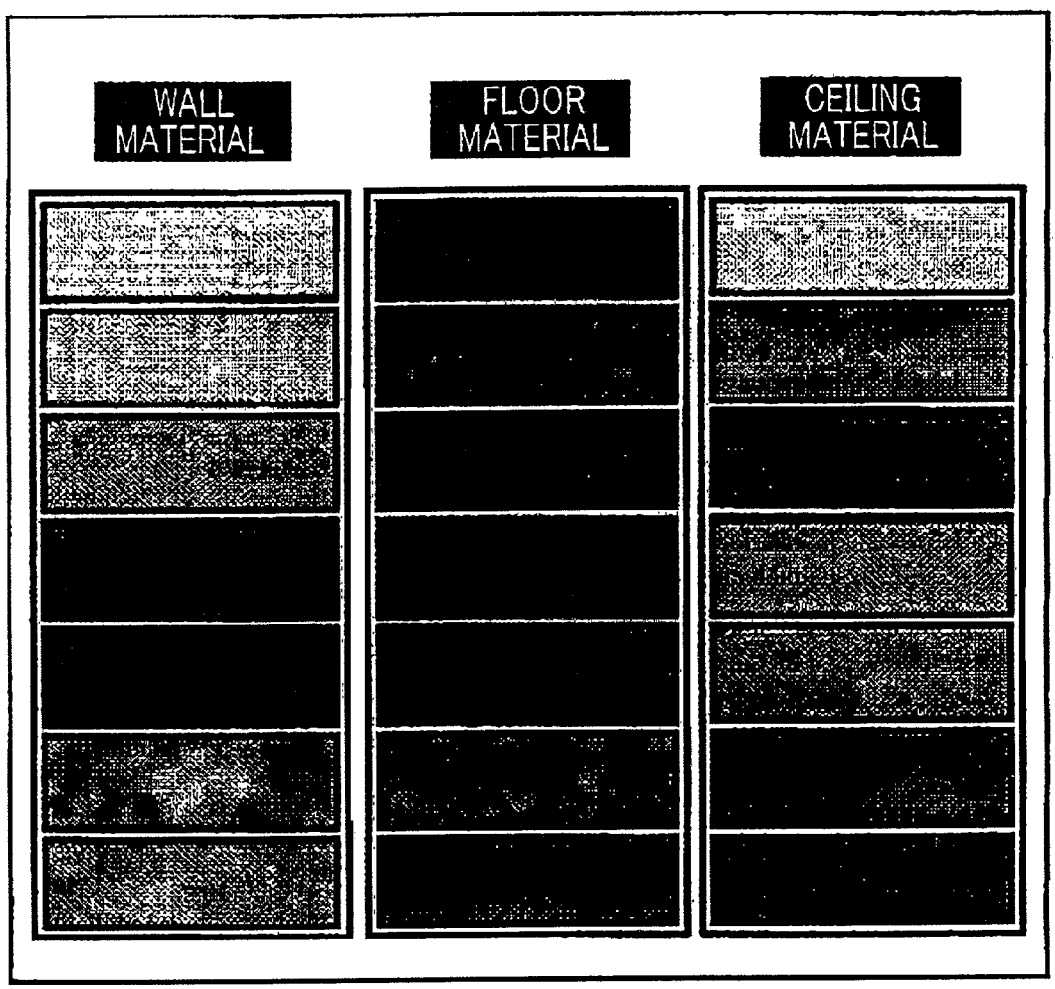
FIG. 18 is a diagram showing another display image of the interior-related object data for selection which are stored in the interior-related object database of the system and are utilizable by operating the interior simulator program.

FIGS. 17 and 18 are diagrams showing screens of interior data selection on which the user selects interior objects such as interior commodity including furniture which are stored in the interior-related object database 26 and read out by the interior simulation program 25.

These screens are displayable simultaneously with an interior simulation screen operable by the interior simulation program 25 as shown in FIGS. 14 to 16 on the browser screen of the client computer 10 by a multi-window function of the client computer 10. In the screen of FIG. 17, the user is enabled to select interior commodity such as lighting equipment and furniture (such as tables and sofas) and other items (such as curtains and plants) which are disposable in the interior of a room in a designed layout with a mouse. Pasting the selected item on the screens of FIGS. 14 to 16 with drag and drop operation and adjusting the orientation of the selected item with a mouse enables the user to arrange the desired item to his/her preferred position and in his/her preferred orientation. In the screen of FIG. 18, the user can select a material for wall, floor, and ceiling with a mouse. Pasting the selected material on the screens of FIGS. 14 to 16 enables the user to freely change the material for wall, floor, and ceiling.

In the interior simulation mentioned above, when the user clicks on a storage button (not shown) on the interior simulation screen, a command of storage is transmitted to the server computer 20. Then, information for specifying the selected item in the interior simulation and information regarding arrangement which designates a position for jointly displaying the items in the designed space are stored in the interior information database 27.

Simultaneously, the layout information database 24 stores information for associating interior information stored in the interior information database 27 with information relating to layout for which the interior simulation has been performed. Thereby, the interior information in association with the layout information can be called out at the time of calling out the layout information from the layout information database 24.

In this way, since the system of this invention is provided with the interior simulation function, modification of interior designing and alteration of furniture can be executable. Thus, not only reviewing of layout but also a more detailed reviewing of design can be performed.

Further, with the interior simulation function, dealers (such as dealers selling interior commodity including furniture, and manufacturers of electric appliances) who sell commodity to be arranged inside and outside a housing can register commodity which they would like to sell in the interior-related object database 26, and display the commodity on the interior data selection screen (see FIGS. 17 and 18) in the interior simulation. With this configuration, the system can be utilized for presenting and selling such commodity. Thus, the user can design a layout within which commodity (such as furniture) which he/she plans to purchase is to be arranged by operating the layout design program 21, and select interior commodity which is suitable for the size of the room and matches with the other interior commodity in the interior simulation.

Further, it is desirable for a user to implement layout design with respect to a facility by utilizing the inventive system on a URL of a facility manufacturer (such as http://www.mew.co.jp). Also, it is preferable to configure the system such that booking to visit a showroom of the facility manufacturer can be performed at the time of storing the result of layout design in the databases 26 and 27 of the server computer 20. With this configuration, upon receiving the booking, the facility manufacturer can prepare concrete proposals, detailed drawings, and estimate considering practically executable items regarding the facility selected by the user or customer before the user visits the showroom for consultation. Thereby, compared to a conventional case where at first a consultation is done which follows creation of drawings and mailing of the drawings, so and so, this configuration realizes a concrete consultation at the time of first meeting, which leads to reduction of meeting time and number of consultations, thereby accomplishing mutually efficient design consultation.

The above business method is not only applied to facility manufacturers but also applicable to furniture manufactures, DIY shops, mass merchandisers, electric appliance shops, curtain shops, other interior commodity shops, etc.

In the case where the user or customer is invited to the showroom, it is preferable to install in the showroom a large-scale virtual reality experiencing system (VR system) employing a high-speed computer designed for graphics and provide a 3D display program of a high performance capable of implementing techniques such as radio city method or ray tracing method to provide the user or customer with an image for virtual experience in the designed space. With this configuration, it is expected that a larger number of users visit the showrooms and the like.

Figure 19:
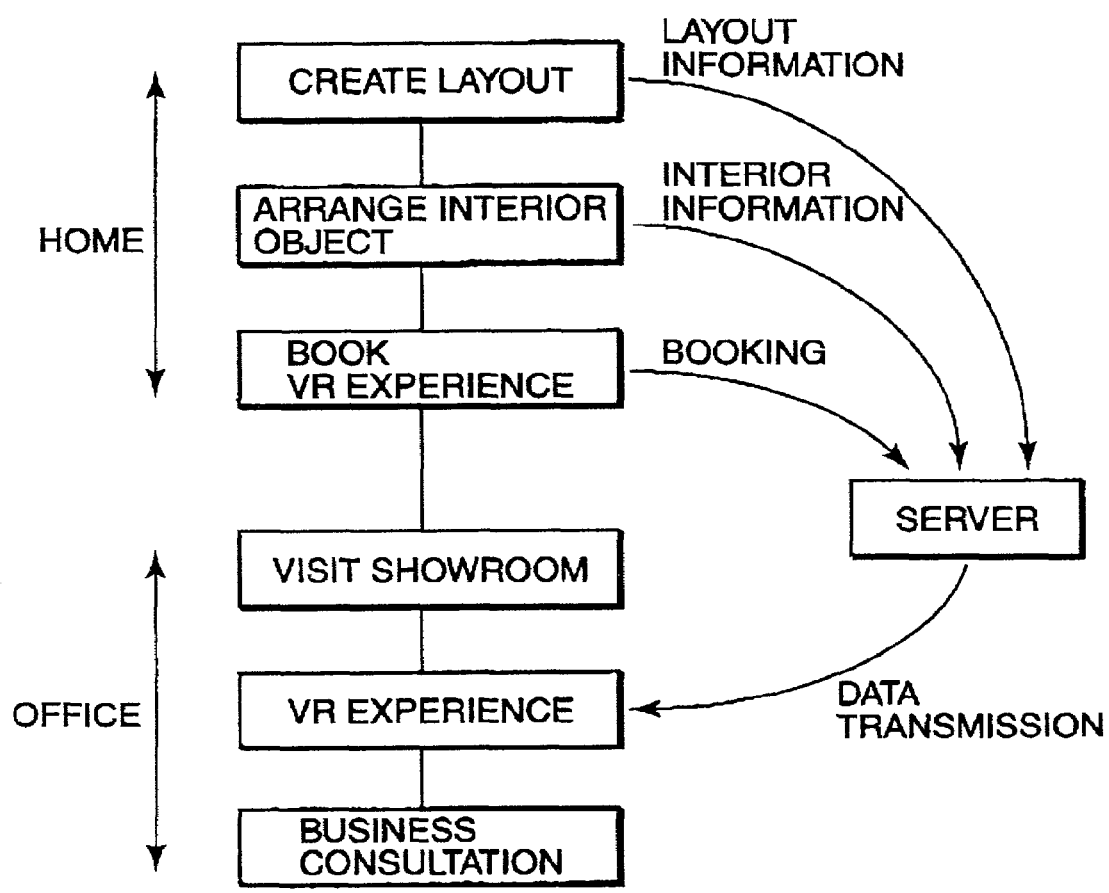
FIG. 19 is a diagram showing a technique of gathering customers (users) to a prototype housing fair and a showroom of housing facility, furniture, lighting equipment, etc.

FIG. 19 is a diagram showing how users or customers are motivated to visit housing fairs including model rooms and showrooms for housing facility, furniture, lighting equipment, etc. A user designs layout on hi/her personal computer (client computer 10), performs simulation with respect to interior commodity including furniture, and stores results of simulation in the databases 24, 27 of the server computer 20. Further, the user checks whether a large-scale VR system is available on the URL (website) on which he/she implemented the layout design and books a visiting date for experiencing virtual realty in the showroom. Then, the user visits the showroom on the booked date, and experiences the layout and interior designed by himself/herself with use of the large-scale VR system. After the experience, dealers proceed with a negotiation with the user based on the layout design plan or the like which the user experienced with the VR system.

Regarding a 3D display program used in the showroom, etc., there may be used a program other than the 3D display program 23 which is provided from the server computer 20 in the case where a general user uses his/her personal computer as the client computer 10. In such a case, the 3D display program used in the showroom, etc. may be provided by means of other storage medium (such as CD-ROM and DVD-ROM).

As mentioned above, according to the first embodiment, all the programs 21, 23, 25 and the databases 22, 24, 26, 27 which constitute the space design aiding system are arranged in the server computer 20. With this configuration, users can utilize the same environment for implementing space design anywhere at anytime as far as the client computer 10 is accessible to the server computer 20.

This configuration realizes the following, for instance. Let's say that a user utilizes a desk-top personal computer in his/her office, and utilizes a portable personal computer outside the office. In such a case, there is no need of installing the same program in the desk-top computer and the portable computer. Further, a salesperson can visit a possible customer without carrying a personal computer and demonstrate what he/she deals with on a personal computer provided on the side of the customer. Also, a customer can utilize the system in the absence of a salesperson to review design. Further, providing the system with a function of voice transmission or message transmission attains service substantially equivalent to a face-to-face service at a store.

According to the system of this embodiment, all the programs 21, 23, 25 are so configured as to be executable by the browser 11 of the client computer 10 in the language of JAVA or HTML. With this configuration, as far as the client computer 10 is accessible to a network, the user can utilize the environment for space design provided by the system with ease without downloading a program or installing an application program.

Furthermore, according to the system of this embodiment, since all the programs 21, 23, 25 are so configured as to be executable by the browser 11 of the client computer 10 in the language of JAVA or HTML, the system is operable independently from the operation environment of the client computer 10. Accordingly, even if, for example, a user who has been using the system on a Macintosh™ personal computer decides to use the system on a Windows™ personal computer, the same system is usable.

Further, a Macintosh™ user and a Windows™ user can view layouts created by the individual computers in their respective environments. With this configuration, there is no need of converting data created by a program for Windows™ into data for Macintosh™ or vice versa, which has been required in the conventional art. This configuration provides trouble-free data conversion.

Exchange of data regarding designing with use of a network is known. Generally known technology includes a technique of sending and receiving data created by CADs (design tools) owned by respective users between the users by way of e-mail and a technique such that a sender uploads data he/she created on a website and a receiver downloads necessary information of the created data when needs arises to do so. In such a conventional technique, a trouble may occur at the time of data exchange due to difference in application programs used by the individuals or difference in version. Thus, data exchange for the purpose of pursuing efficiency may result in inefficiency. The system proposed by the inventors of this application provides means for solving this problem.

In the case where a freely usable environment by anyone may jeopardize benefits of a system developer, it is desirable to configure the system as follows. Specifically, the server computer 20 is provided with a database which administers an ID number of a system user (contractor), provided with a configuration in which a referral operation is implemented with respect to the database upon receiving an access from the client computer 10, all the data stored in the object database 22 and the interior-related object database 26 are publicized in the case where it is judged that the access is from the contractor, and merely certain publicized part which is provided for free is rendered usable in the case where it is judged that the access is not from the contractor.

This configuration is advantageous in that the user feels the system established because he/she can make contract with a system provider after experiencing the system by himself/herself, which resultantly leads to a business success for the system provider. In the case where a program in a demonstration version is not available, it is likely that performance of the program is evaluated lower than what it actually is with the result that sales price of the program is the only medium for acquiring customers. However, since some publicized part is provided for free in the system configuration of this invention, the user can properly evaluate the performance of the system.

Hereinafter, a space design aiding system with use of a network according to second through seven embodiments of this invention are described with reference to FIGS. 21 through 35. It should be noted that a description of constituent elements in these embodiments which are identical to those in the first embodiment is omitted.

A system according to a second embodiment (hereinafter, referred to as "second system") is so configured as to aiding various tasks relating to moving based on the configuration of the system in the first embodiment (referred to as "first system"). The second system is described with reference to FIG. 20.

Figure 20:
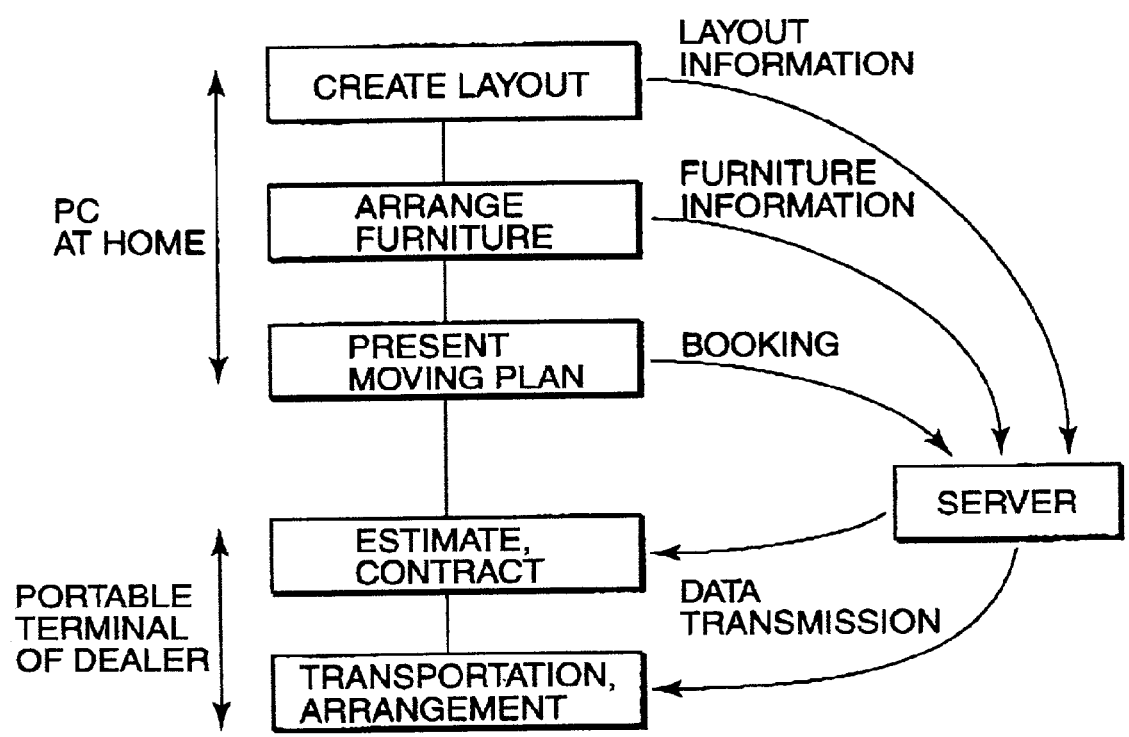
FIG. 20 is a diagram showing information flows in a second embodiment of this invention.

A configuration of hardware of the second system is the same as that of the first system. FIG. 20 is a schematic diagram showing information flows in the second system.

As shown in FIG. 20, a user who plans to move accesses the server computer of the system on his/her personal computer at home, creates a layout map of a house for moving on a website, performs simulation as to how furniture is to be arranged, and stores results of simulation in the server computer. Also, the user can demand a plurality of dealers handling moving for estimates on the same website.

Upon receiving request for estimate for moving, the dealer visits the user carrying a portable terminal or mobile computer, and submits estimate after verifying on the site furniture which correspond to the furniture data transmitted from the server computer. At the time of transporting the furniture to the place for moving after finalizing a contract, the dealer can arrange the furniture as the user desires by utilizing the furniture data transmitted from the server computer.

With this configuration, the user is not required to fill in various information on a contract sheet (such as new address after moving and former address before moving) because these information have been inputted on the website. Further, there is no necessity of specifically instructing the dealer as to how to arrange the furniture in the place after moving. Also, since the dealers handling moving business can utilize the data stored in the server computer, operations of filing details about belongings to be transported in estimate and contract sheets can be omitted to a remarkable extent.

A system (hereinafter referred to as "third system") in accordance with a third embodiment of the invention is so configured as to aiding sales of land and house with land by housing manufacturers who sell houses with land, builders, or land agencies. The third system is described with reference to FIGS. 21 and 22.

Figure 21:
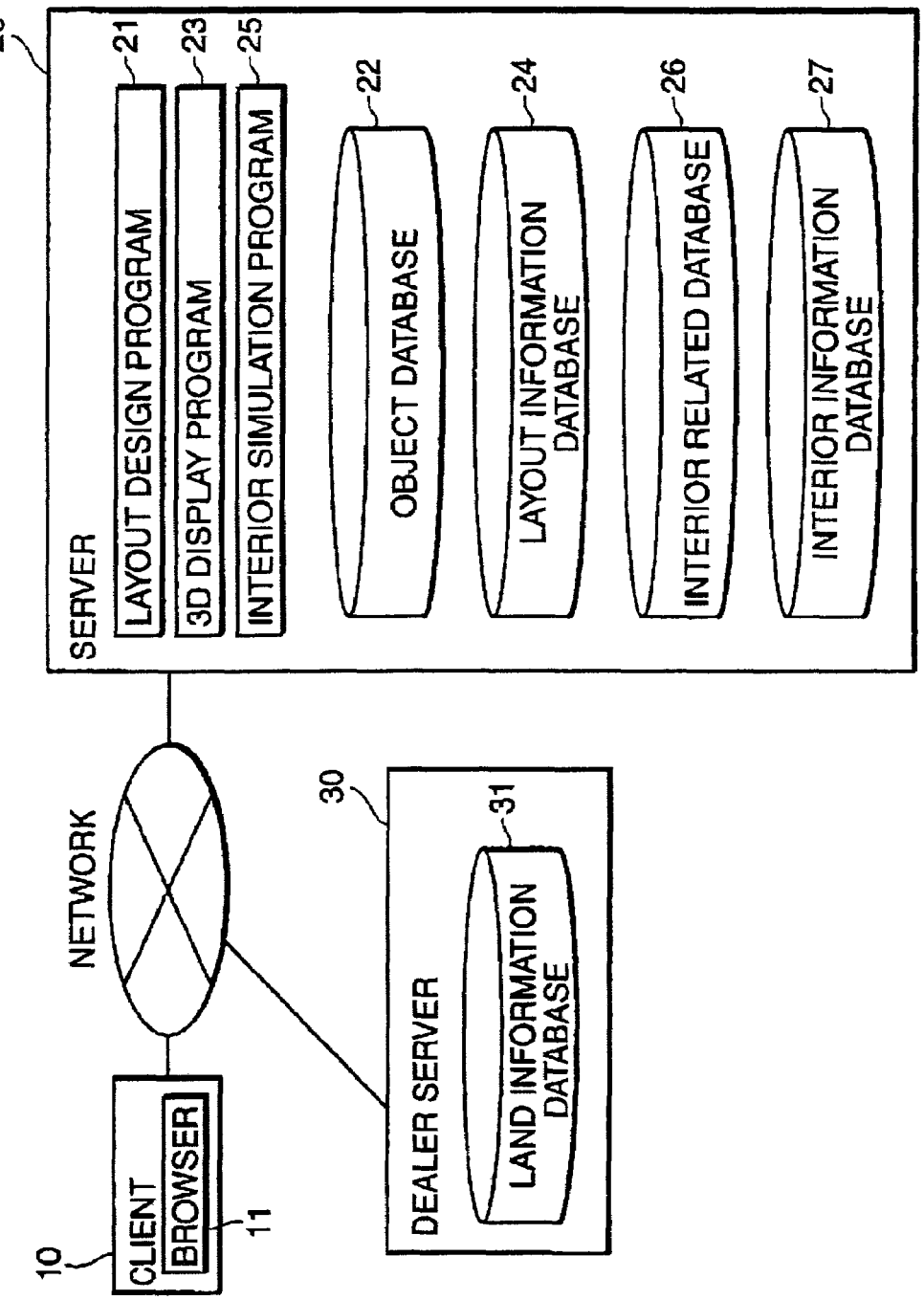
FIG. 21 is a schematic diagram showing an entire configuration of a system in accordance with a third embodiment of this invention.
Figure 22:
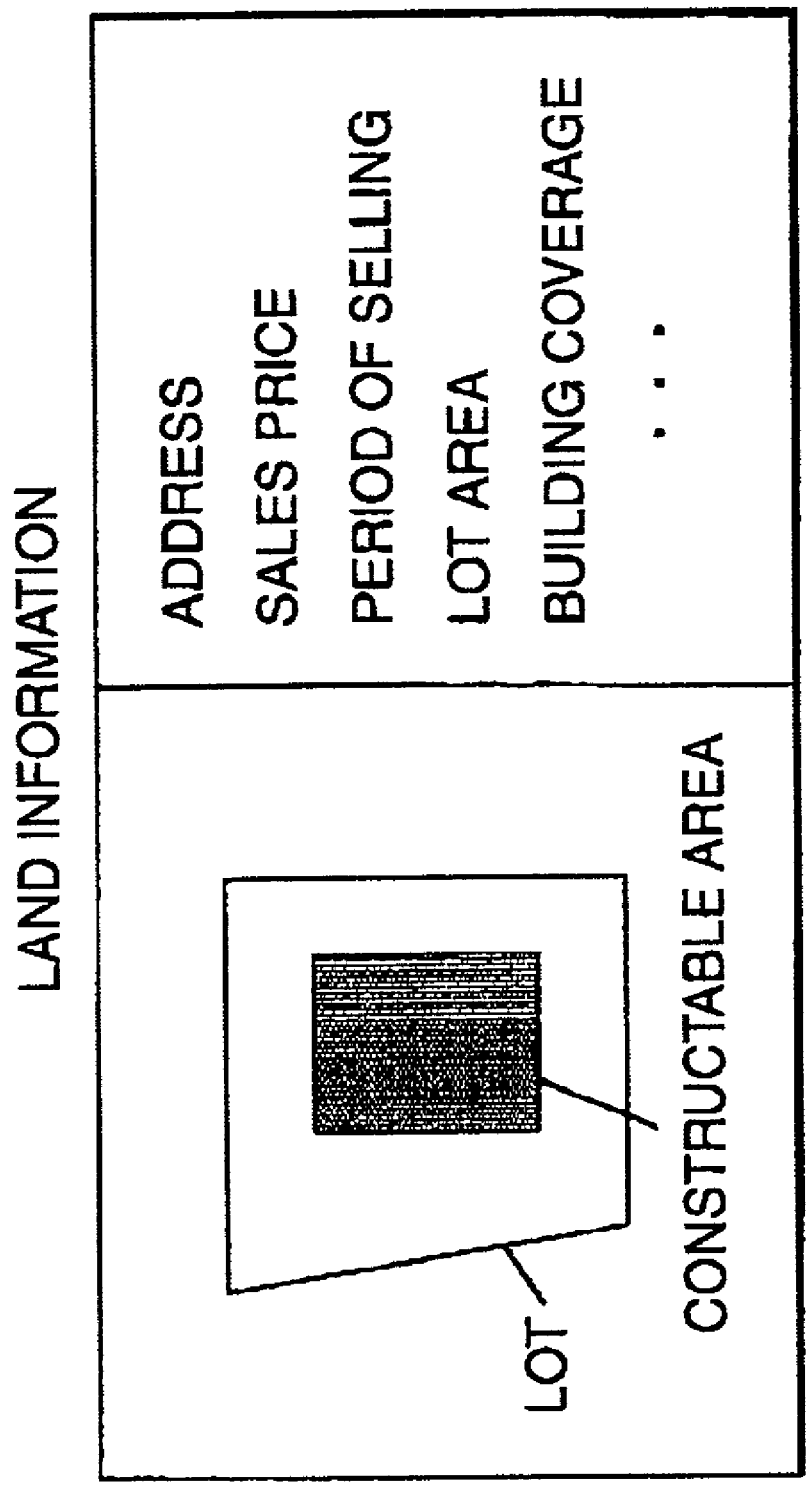
FIG. 22 is a diagram shaving a display of land information stored in a land information database of the System shown in FIG. 21.

FIG. 21 is a schematic diagram showing an entire configuration of the third system. In FIG. 21, a dealer server computer 30 is a server computer linked to a network administered by a land agency or the like. The dealer server computer 30 includes a land information database 31 which stores information relating to a variety of lands. As shown in FIG. 22, in the land information database 31, preregistered are information relating to lands to be sold including data regarding the address, sales price, period of selling, lot area, building coverage with respect to each of the lands, and an area within which a house is authorized to be built in terms of information based on a plan view.

According to the third system, a user (prospective purchaser of a land) accesses the URL of the dealer server computer 30 via a network from a client computer 10, and freely browses the land information registered in the land information database 31, and downloads the information of the land which the user wishes to purchase (see FIG. 22).

Next, the user accesses the URL of a server computer 20, which is a main administrator of the third system, by using a function of linking to the Internet from the dealer server computer 30 through which the land information has been obtained. Upon accessing the website (URL), the user is provided with an environment which enables the user to automatically utilize a layout design program 21 on a browser screen of the client computer 10. At this time, the layout design program 21 is functioned to display a lot area within which a house is authorized to be built based on the obtained land information based on a plan view. Thus, the user can proceed with layout design in a similar manner as in the first embodiment based on a requirement that the layout is to be designed within the authorized area. With this configuration, the user (customer) can carry on layout design without the knowledge about the building regulation, etc. If the user (customer) is satisfied with the land after implementing the layout design about the land, he/she notifies the dealer of his/her plan to purchase the land.

According to the third system, a prospective purchaser (user) is provided with an environment which enables the user to grasp what size of a house is authorized to be built within the land which he/she plans to purchase. Thereby, business relating to land and house with land can be promoted.

A system (hereinafter, referred to as "fourth system") in accordance with a fourth embodiment of the invention is so configured as to aiding sales of houses constructed according to so-called "skeleton-infill" technique hereinafter, simply referred to as "SI houses") by housing manufacturers who sell SI houses, builders who build such houses, or construction managers of SI houses. The fourth system is described with reference to FIGS. 23 through 25.

The SI house is a house in which a skeleton portion (such as main frames, and common facility) and a fill-in portion (such as interior commodity and layout) are independently provided. A prospective purchaser (customer) can freely design the fill-in portion within A predetermined skeleton portion.

Figure 23:
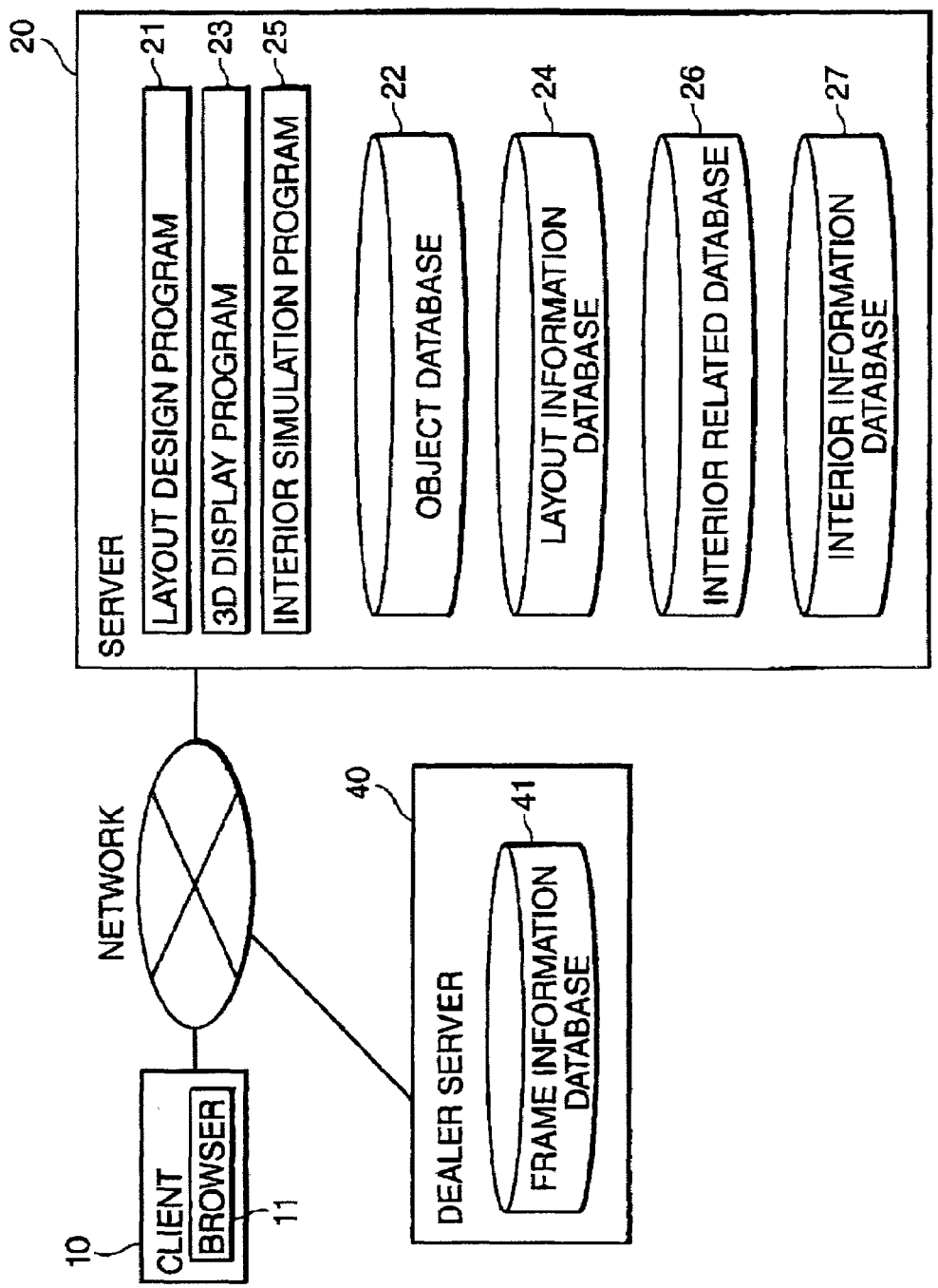
FIG. 23 is a diagram showing an entire configuration of a system in accordance with a fourth embodiment of this invention.

FIG. 23 is a schematic diagram showing an entire configuration of the fourth system. A dealer server computer 40 is a server computer which is linked to a network and is administered by a dealer such as a housing manufacturer who sells SI houses. The dealer server computer 40 includes a frame information database 41 which stores information relating to frames of SI houses to be sold. In the frame information database 41, preregistered are 3D information including at least information relating to pillars, beams, and plumbing as information relating to frames of SI houses to be sold.

According to the fourth system, a user who is a prospective purchaser of a SI house accesses the URL of the dealer server computer 40 via a network from a client computer 10, browses frame information registered in the frame information database 41, and downloads frame information regarding a house which the user plans to purchase.

Next, the user accesses the URL of a server computer 20, which is a main administrator of the fourth system, by using a function of lining to the Internet from the dealer server computer 40 through which the frame information has been obtained. Upon accessing the website (URL), the user is provided with an environment which enables the user to automatically utilize a layout design program 21 on a browser screen of the client computer 10. At this time, the layout design program 21 is functioned to display frame information in a plan view, based on the registered frame information. The user is banned from changing the frame information at this time. More specifically, constraint regarding the frame information includes that frames such as pillars and beams are fixed, facility relating to plumbing is fixed in view of plumbing arrangement, and the position of a porch is fixed.

Figure 24:
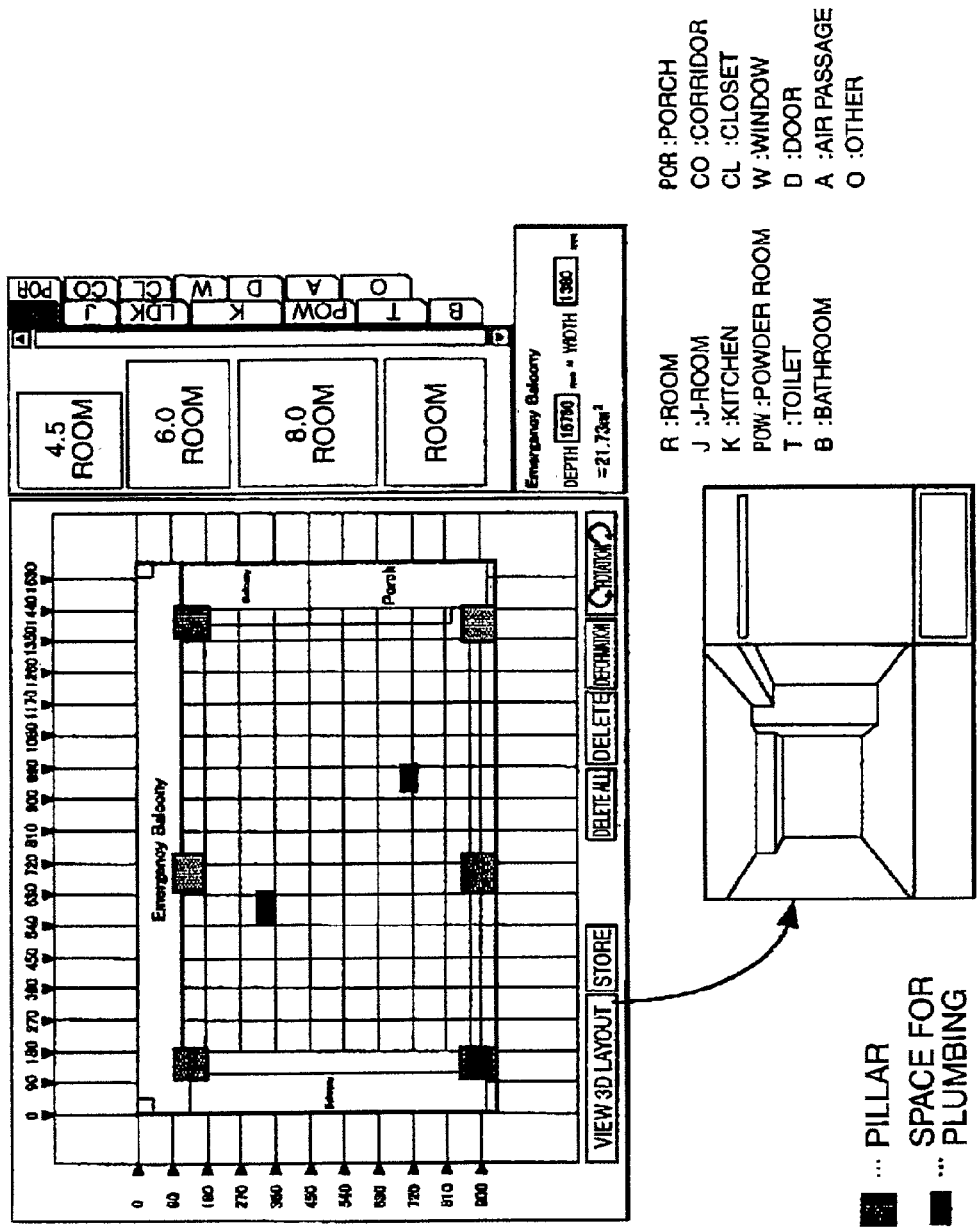
FIG. 24 is a diagram illustrating a display image showing a layout in a house to be built according to skeleton-infill technique.
Figure 25:
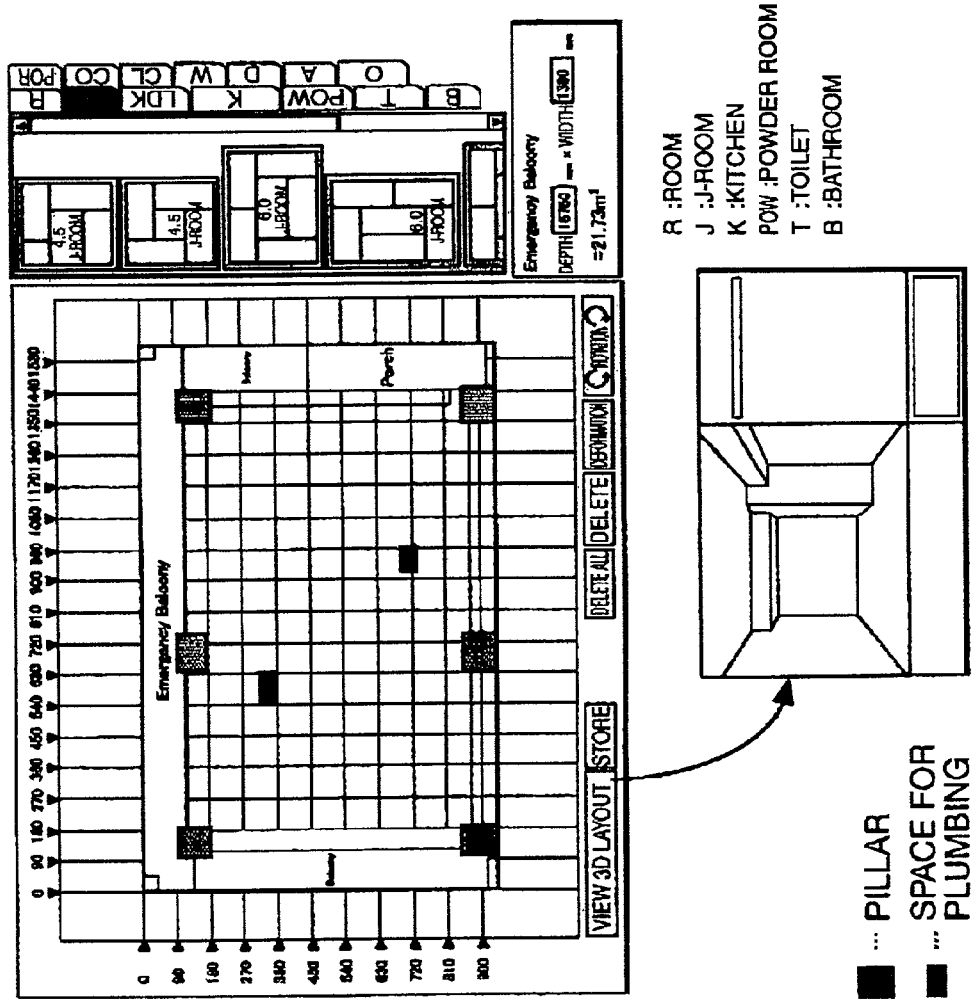
FIG. 25 is a diagram illustrating a display image showing another layout in a house to be built according to skeleton-infill technique.

FIGS. 24 and 25 are exemplary diagrams showing a layout design screen operated by the layout design program 21. As shown in FIGS. 24 and 25, pillars, beams and plumbing as frame information are displayed at fixed (non-changeable) positions, respectively in a plan view. In this state, the user arranges a plurality of objects constituting layout of a house in a similar manner as in the first embodiment, and proceeds with layout design at his/her will within the constraint with respect to the frames.

The layout design program 21 is, as shown in a lower right section in FIGS. 24 and 25, equipped with a function of displaying the area of objects arranged in a plan view in terms of a numerical value. Thus, the user can verify the area of each object within the constraint of frames during layout design.

Further, upon completion of the layout design based on a plan view or during layout design, the user clicks on a "VIEW 3D LAYOUT" button in FIGS. 24 and 25. Thereupon, the 3D display program 23 is activated to display the layout in the terms of a 3D image in a similar manner as in the first embodiment. Thus, the user can verify how the frames such as pillars, beams, and plumbing may affect the appearance or usability of the room.

With this configuration, the user (customer) can carry on layout design without taking into account requirements inherent to SI houses that frames such as pillars, beams, and plumbing cannot be altered.

According to the fourth system, a prospective purchaser (user) who plans to purchase a SI house is provided with an environment which enables the user to consider how frames such as pillars, beams, and plumbing would affect the appearance or usability of the room prior to purchasing. Thus, the fourth system aids decision making for a prospective purchaser of a SI house.

A system (hereinafter, referred to as "fifth system") in accordance with a fifth embodiment is so configured as to aid providing information of rental items (leasehold property) by lenders or agencies who deal with rental items such as rental housings or rental offices and shops. The fifth system is described with reference to FIGS. 26 and 31.

Generally, a cycle of business regarding rental items is short, and accordingly, offer of such items is required to be quickly updated as the items are available for let. However, information publicized on a website which is available at present for introducing rental items has a limitation that it is difficult for a lessee (prospective customer) to imagine how rooms of a rental item look like. Accordingly, in the current business regarding rental items, information which promotes decision making for a prospective customer is insufficient. The fifth system is configured to solve the above problems.

Figure 26:
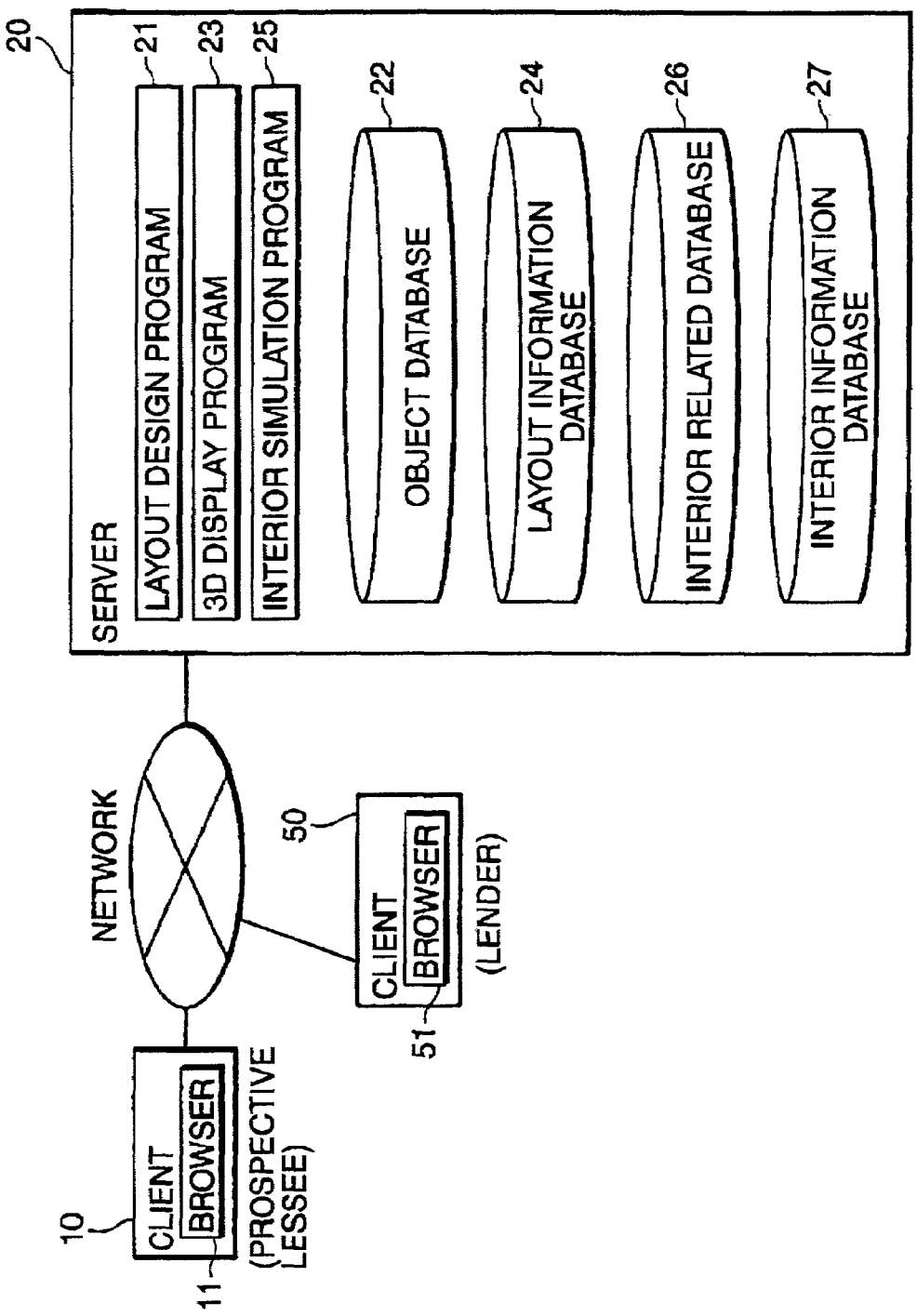
FIG. 26 is a diagram showing an entire configuration of a system in accordance with a fifth embodiment of this invention.

FIG. 26 is a schematic diagram showing an entire configuration of the fifth system. As shown in FIG. 26, in the fifth system, there exist a client computer 50 which is used by a lender (user) who plans to lend a rental item and a client computer 10 which is used by a prospective lessee (user) who plans to rent the item, as a client computer accessible to a server computer 20 which is a main administrator of the fifth system via a network. It should be appreciated that the client computer 10 and the client computer 50 may be plural. The lender includes an agency who handles introduction of the item.

Figure 27:
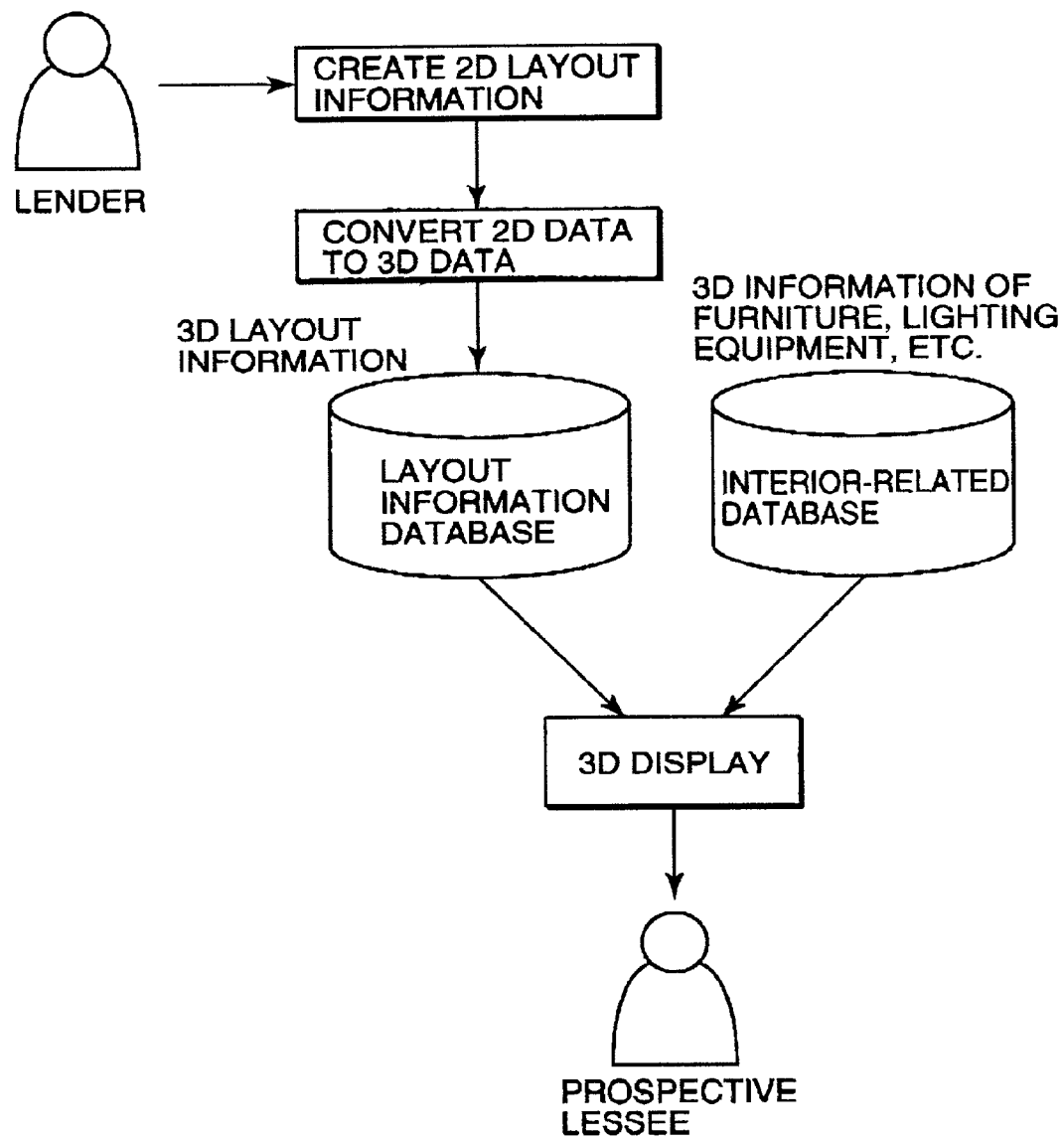
FIG. 27 is a diagram showing information flows in the fifth system.

According to the fifth system, as shown in information flows in FIG. 27, a lender inputs information relating to a layout of a rental item, etc. Then, a 3D display image showing the layout is available for a prospective lessee and browsable by the prospective lessee in combination with furniture, lighting equipment, etc.

Specifically, a lender (user) accesses a website (URL) of the server computer 20, creates layout information regarding a rental item by using a layout design program 21 operable on a browser 51 of the client computer 50 in a similar manner as in the first embodiment, and registers the designed layout in a layout information database 24. At this time, information regarding the item such as the address, rental rate, fees for common utilities, approximate date for rent allowed, and other requirements with respect to the item are stored in association with the layout information of the item. In the case where there exist a plurality of items whose layouts are similar to one another, a most general layout among the layouts may be stored.

A prospective lessee (user) accesses the URL of the server computer 20 from the client computer 10, and searches for a rental item on the website through which the user is enabled to retrieve the layout information database 24. Specifically, for example, when the user designates a requirement (namely, region where he/she wants to live), as shown in FIG. 28A, housing information which matches the requirement is extracted as shown in FIG. 28B, and a list of items are displayed on a browser screen of the client computer 10. The server computer 20 is equipped with the above function.

The prospective lessee (user) selects one or more items from the list, and manipulates a "VIEW 3D LAYOUT" button on the browser screen. Then, a 3D display program 23 is activated to enable the user to browse the layout of the selected item in the terms of a 3D image on the browser screen of the client computer 10.

Furthermore, the prospective lessee can perform interior simulation regarding arrangement of furniture and modification of other interior commodity with respect to the item displayed in the terms of a 3D image by using an interior simulation program 25 in a similar manner as in the first embodiment. Results of interior simulation are stored in an interior information database 27. With this interior simulation, the prospective lessee can freely arrange furniture and lighting equipment with respect to the item according to his/her preference, intuitively grasp a status as to how the rooms look like after settlement, and be motivated for decision making as to whether he/she would like to rent the item considering his/her impression about the item.

Figure 29:
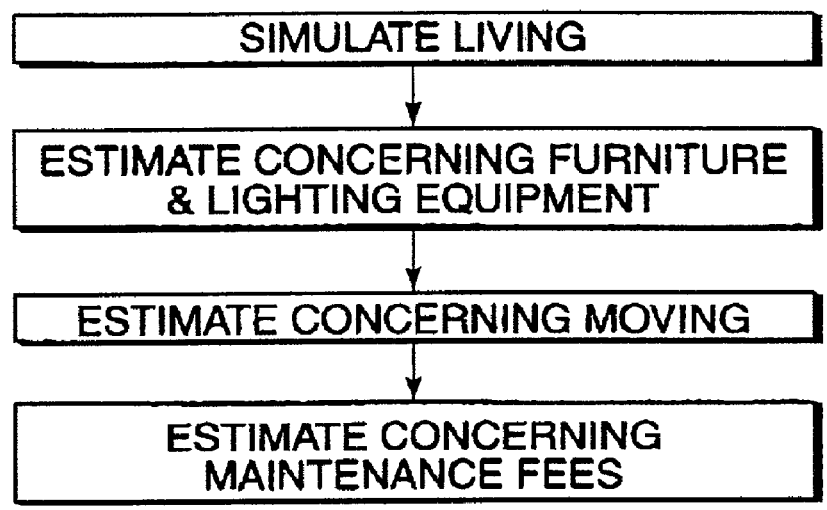
FIG. 29 is a diagram showing the function of the fifth system that is provided to a prospective lessee.

Further, as shown in FIG. 29, the fifth system has, in addition to the interior simulation function, a function of providing estimate regarding various fees required for moving in a rental item so as to aid a prospective lessee for decision making to rent the item.

Figure 30:
FIG. 30 is an exemplary display image showing a button for asking estimates of various costs.

FIG. 30 is an exemplary diagram showing an ESTIMATE button displayed on the browser screen of the client computer 10. This button is displayed on the interior simulation screen of the client computer 10 (see FIGS. 14 to 16), for example, as a banner advertisement. When the prospective lessee (user) manipulates this button after designating the item for which he/she requests estimate, the server computer 20 is functioned to calculate estimate for arranged furniture and lighting equipment which he/she plans to purchase based on information relating to sales prices of interior commodity stored in an interior-related object database 26, and display the results of estimate on the browser screen of the client computer 10. At this time, it may be preferred that a button which enables the prospective lessee to order purchase of the furniture and/or lighting equipment is displayed on the browser screen when the prospective lessee has reached a rental agreement with the lender. With this preferred configuration, the prospective lessee can place an order immediately after viewing the estimate. Also, the prospective lessee can repeat interior simulation as many times as he/she desires to set the total cost within his/her budget based on the results of estimates.

When the prospective lessee demands for estimate regarding moving, the server computer 20 is functioned to transmit information relating to the furniture or the like which he/she selected in the interior simulation to a plurality of dealers handling moving so that the dealers can submit their estimates. Results of the estimates are transmitted to the client computer 10 of the prospective lessee (user) and displayed on the browser screen thereof. The fifth system may be so configured that the user can determine one of the dealers based on the results of the estimates and makes contract with the dealer on moving instantaneously on the browser screen after he/she has reached a rental agreement with the lender.

Furthermore, when the prospective lessee requests for estimate regarding maintenance fee with respect to the item, the server computer 20 is functioned to calculate the maintenance fee based on data relating to the rental rate and the common utilities fees which are derived from the housing information stored in the layout information database 24 and data relating to power consumption, which is stored in the interior-related object database 26, with respect to the lighting equipment and air conditioner(s) selected by the prospective lessee in the interior simulation, and display results of calculation on the browser screen of the client computer 10.

With these configurations, the prospective lessee can obtain necessary information from time to time according to his/her requirements, which makes it possible to promote decision making for rent.

Figure 31A:
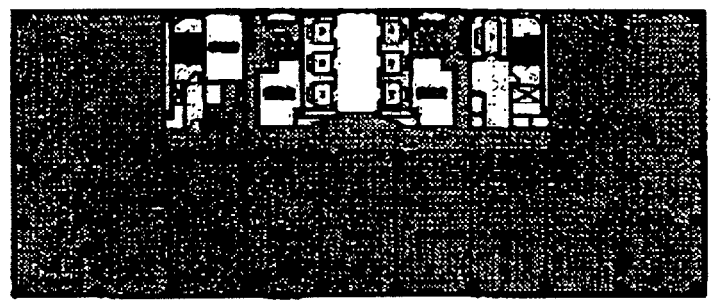
FIG. 31A is a display image showing a layout of the office.
Figure 31B:
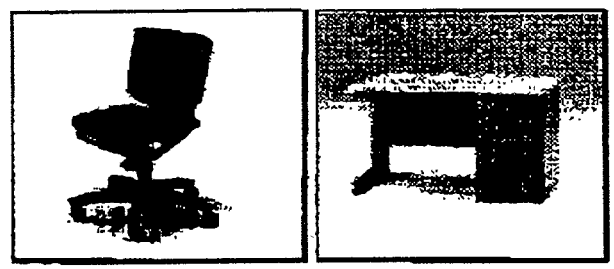
FIG. 31B is a display image showing furniture such as a desk and a chair which is to be arranged in the office.
Figure 31C:

In the case where a rental housing is a rental office in a building, for example, as shown in FIG. 31A, the following is implemented. Furniture such as desks and chairs designed for office-use as shown in FIG. 31B are displayed, a status as to how the office will look like in an actual use is simulated as shown in FIG. 31C. Thus, a user can determine whether the rental building (rental office) satisfies his/her requirements.

In the case where a rental housing is a shop or a store, a status as to how commodity is to be displayed and what gathering of possible customers will be like can be simulated Thus, a user can utilize the fifth system for the purpose of grasping potential commercial profit with respect to the shop (store) before actually renting the item.

Database which stores information relating to rental items is not necessarily provided in the server computer 20, which is a primary system administrator, but may be provided in a server computer administered by an agency dealing with rental items, as shown in the third and fourth embodiments. In the altered configuration, a prospective lessee searches for housing information which satisfies his/her requirement on the homepage of an agency, and is guided to the server computer 20 which provides users with service of allowing browsing of 3D designed layout through a linking function of the Internet by manipulating the "VIEW LAYOUT" button displayed on the browser screen of the client computer 10.

The above description has been made on the basis that the server computer 20 is provided with the layout design program 21 and the object database 22 which enable a lender (or agency) to input layout information on the client computer 50. Alternatively, in the case where a user is a real estate agency who deals with a large number of items, the fifth system may be so configured that information relating to such a large number of items is stored in a storage medium such as CD-ROM and DVD-ROM and that the users are authorized to utilize the network only when the layout information or the like is registered in the server computer 20. With this altered configuration, the user does not have to worry about the access fee to the Internet which may hinder the user from using the system, and a burden on the server computer 20 due to a long-time access to the server computer 20 by the agency can be reduced.

Furthermore, providing a function which enables a lender to designate publication/non-publication of information relating to each of the items uploaded on the layout information database 24 of the server computer 20 enables to administer the information relating to the items stage by stage until a contract is finalized. The stages include a stage of making draft, a stage of reviewing whether publication is allowed, a stage that an item is contracted after publication, etc. Thereby, the fifth system is usable efficiently even in the case where a lender is an agency who deals with a bulky number of items.

Moreover, there is a case that a prospective lessee designs a layout according to his/her wish by using the layout design program 21. In this case, providing the server computer 20 with a function which enables the prospective lessee to search for a layout which is similar to the designed layout among items information stored in the layout information database 24 enables to provide detailed search of the item(s) which may match the requirement of the prospective lessee.

A system (hereinafter, referred to as "sixth system") in accordance with a sixth embodiment of the invention is so configured as to provide an environment for matching requirements between customers who place order of building houses and designers/architects in charge of designing/constructing houses. The sixth system is described with reference to FIGS. 32 to 33.

Heretofore, there has been known a website such as http://karasu.net/hc/ which provides customers and designers with a chance of knowing each other on the Internet. However, these websites do not have an integrated design tool program, and accordingly, even if designers propose many designing plans, these plans cannot be compared and reviewed under the same environment. Further, grades of designing plans depend on the performance of a design tool program. Accordingly, designers have to hold a design tool program of high performance all the time. This is not a desirable environment for the designers. The sixth system is so configured as to solve this problem.

Figure 32:
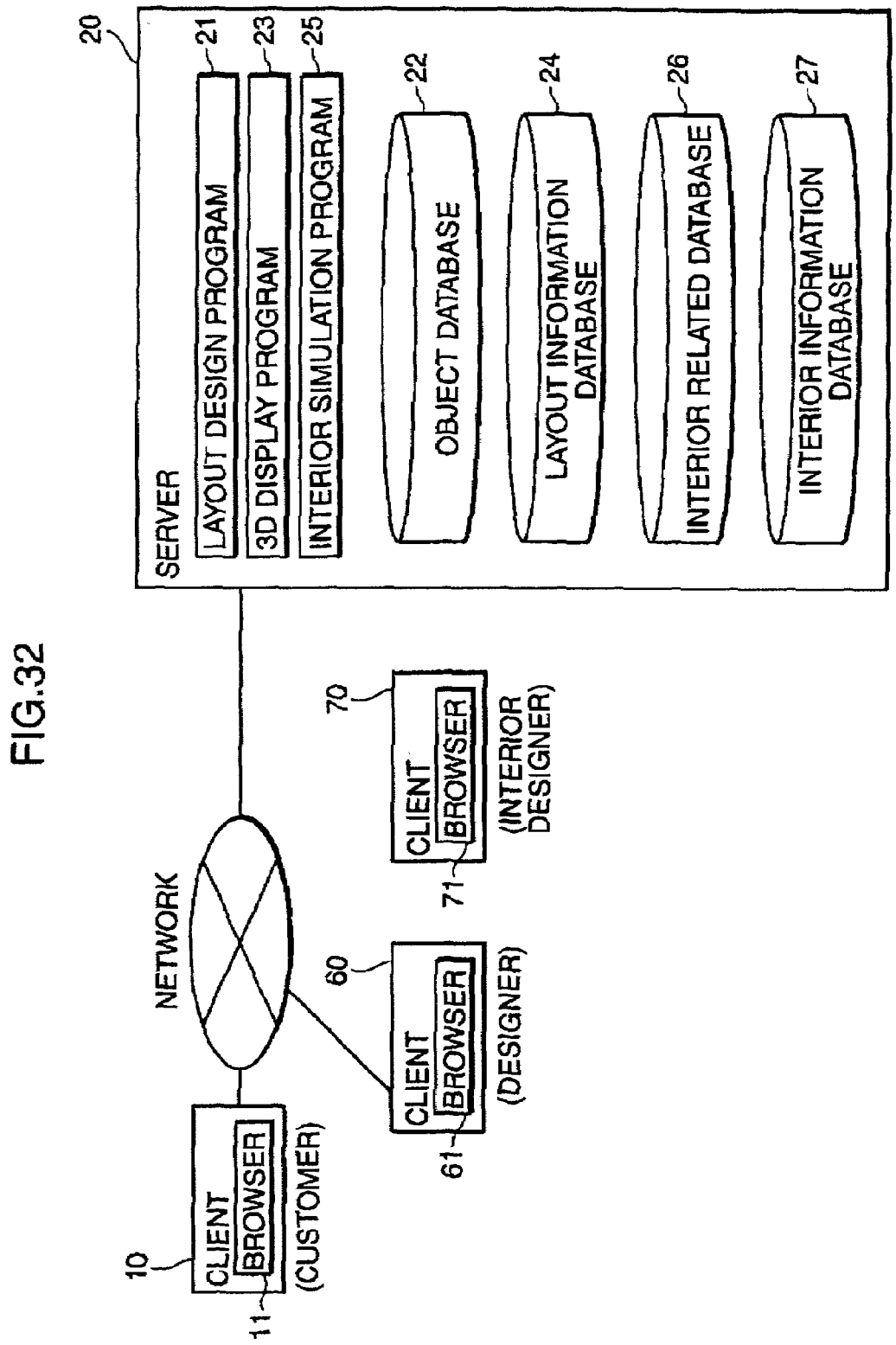
FIG. 32 is a diagram showing an entire configuration of a system in accordance with a sixth embodiment of this invention.

FIG. 32 is a schematic diagram showing an entire configuration of the sixth system. As shown in FIG. 32, in the sixth system, there exist a client computer 10 which is used by a customer (user) who places order of building a house, a client computer 60 which is used by a designer/architect (user) in charge of designing/constructing a house, and a client computer 70 which is used by an interior designer (user) who designs interior of a house, as a client computer accessible to a server computer 20 which is a main administrator of the sixth system via a network. It should be appreciated that each of the client computers 10, 60, and 70 maybe plural.

Figure 33:
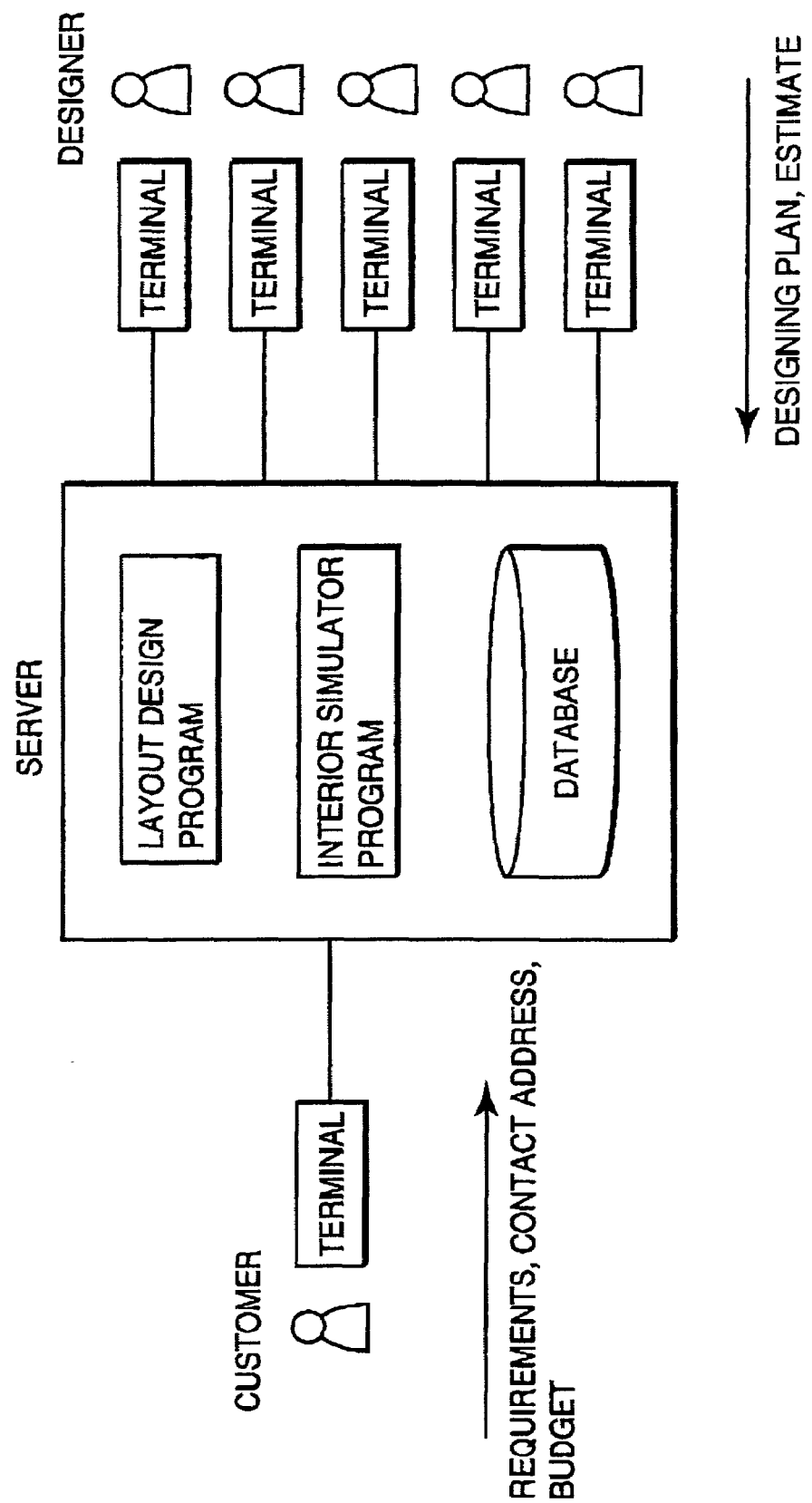
FIG. 33 is a diagram showing information flows in the sixth system.

In the sixth system, as shown in information flows shown in FIG. 33, a customer inputs data regarding requirements about a house, his/her contact address, and a budget for building the house. A plurality of designers and architects submit designing plans and estimates depending on the requirements.

Specifically, a customer (user) accesses the server computer 20 from the client computer 10 via a network, creates a layout (draft) he/she wishes for a house by using a layout design program 21 activated by a browser 11 of the client computer 10 in a similar manner as in the first embodiment, and registers information relating to the layout in a layout information database 24. At this time, the customer registers information necessary in construction/design, such as allotted area of site for the house, purpose for building the house, desired style of the house, data about family members, manner of living, etc., along with a budget for the house and information necessary for contacting the customer (such as postal address, telephone number, and electronic mail address) in association with the layout information.

On the other hand, a designer (including design office, construction company, builder, manufacturer of housing) accesses the URL of the server computer 20 from the client computer 60, and browses the drafted layout which has been created by the customer and stored in the layout information database 24. Any designer who thinks he/she can design/construct a house having the layout desired by the customer within the budget presented by the customer submits estimated cost for designing/constructing the house to the customer.

In the case where change is made with respect to the drafted layout created by the customer, the information relating to the layout which is stored in the layout information database 24 is read out from the layout design program 21, change is made with respect to the drafted layout, and the changed layout information (design plan) is stored in the layout information database 24 under a file name different from the file name given to the layout information regarding the drafted layout. In other words, the layout design program 21 has a function of opening an existing file, a function of changing the opened file, and storing the changed file in a file name different from the file name given to the existing file. The file name for identifying the changed file is presented to the customer together with the estimated cost by an electronic mail or the like.

In this way, the changed layout information is stored in the layout information database 24 to which the customer is accessible. Accordingly, the sixth system is advantageous in that the designer does not have to transmit a layout design plan which has a large file size as an attached file to the customer via an electronic mail.

The sixth system is advantageous in the following aspect. Since a customer creates a layout based on a premise that the designer will change the drafted layout from a professional viewpoint, the customer is not required to create a complete layout at the time of drafting a layout he/she wishes for the house. In this way, the customer is informed of a variety of estimated costs and revised layout information (designing plans) from a plurality of designers. With this configuration, the customer selects a designer according to his/her wish, and proceeds with concrete designing with the designer.

In the sixth system, interior simulation can be implemented with respect to the layout created by a customer and the layout revised by a designer in a similar manner as in the first embodiment by using an interior simulation program 25. In this case, the customer creates a draft for interior information according to his/her preference, and stores information relating to the interior information along with a budget for interior commodity.

On the other hand, an interior designer (including interior coordinator and interior commodity seller) accesses from the client computer 70 to the URL of the sever 20, and browses interior information which has been stored in the interior information database 27. An interior designer who thinks he/she can furnish the interior commodity the customer plans to purchase within the budget presented by the customer presents estimated cost for the interior commodity via an electronic mail or the like.

In the case where a revision is made with respect to the drafted plan presented by the customer, the interior designer retrieves the interior information relating to the drafted plan from the interior information database 27 by using the interior simulation program 25, revises the plan, and stores the revised interior information in the interior information database 27 in a file name different from the file name given to the interior information stored by the customer. In other words, the interior simulation program 25 has a function of opening an existing file, a function of revising the opened file, and storing the revised file in a file name different from the file name given to the existing file. The file name for identifying the revised file is presented to the customer together with the estimated cost by an electronic mail or the like.

In this way, the revised interior information is stored in the interior information database 27 to which the customer is accessible. Accordingly, the sixth system is advantageous in that the interior designer does not have to transmit interior information which has a large file size as an attached file to the customer via an electronic mail.

The sixth system having the above configuration is advantageous in the following aspect. Since a customer creates interior information based on a premise that an interior designer will revise the draft plan from a professional viewpoint, the customer is not required to submit a complete plan at the time of arranging interior objects he/she wishes for the house.

In this way, the customer is informed of a variety of estimated costs and revised concrete interior information (interior plans) from a plurality of interior designers. With this configuration, the customer selects an interior designer according to his/her preference, and proceeds with concrete interior designing with the interior designer.

Alternatively, the customer does not have to draft an interior plan of his/her own. In the altered configuration, an interior designer may implement interior design based on the layout information stored in the layout information database 24. In this altered configuration, the customer may register the budget in the layout information database 24 or the like.

Thus, publicizing layouts and interior objects which customer wishes for the house on the Internet enables the customer to search for different types of layout designers including design offices, construction companies, builders, and housing manufacturers, as well as interior designers including interior coordinators and interior commodity sellers as far as the customer is accessible to such information providers.

According to the configuration of the sixth system, the layout information program 21 and the interior simulation programs 25 are provided in the server computer 20 and publicized as a "platform" usable by customers and designers in common. Thereby, information relating to space which is difficult to explain through verbal communication can be conveyed with ease. Also, comments concerning the layout and interior arrangement from a designer are transmitted to a customer aided by an image, which provides better communication between the designer and the customer.

Furthermore, according to this configuration, a plurality of designers implement layout design with use of the layout design program 21 provided in common. Likewise, a plurality of interior designers implement interior designing with use of the interior simulation program 25 provided in common. Thereby, a customer can compare and review a number of designing plans under the same environment.

Moreover, this configuration is free from grades of designing which may vary depending on a design tool used by designers. Accordingly, this configuration provides a desirable environment for the designers.

It should be noted that an external appearance of a house is one of significant elements which makes a house attractive. In view of this, the interior simulating function may have a function of implementing simulation with respect to exterior of a house. The exterior of a house includes roof tiles, outer walls, gates, rainwater guiding pipes, plants, and fences.

A system (hereinafter, referred to as "seventh system") in accordance with a seventh embodiment of the invention is so configured as to provide an environment for matching requirements between customers who place order of building houses and designers and dealers engaged in construction business in charge of designing/constructing houses (hereinafter, simply referred to as "dealer" or "corporation") in a similar manner as in the sixth embodiment. The seventh system is described with reference to FIGS. 34 and 35. The seventh system is different from the sixth system in that the seventh system is so configured as to enable a customer to revise a layout or interior information which he/she wishes for a house according to his/her preference based on draft plans which have been registered by a plurality of dealers, without presenting the layout and interior information to the dealers. A configuration of hardware constituting the seventh system is the same as that of the sixth system.

Figure 34:
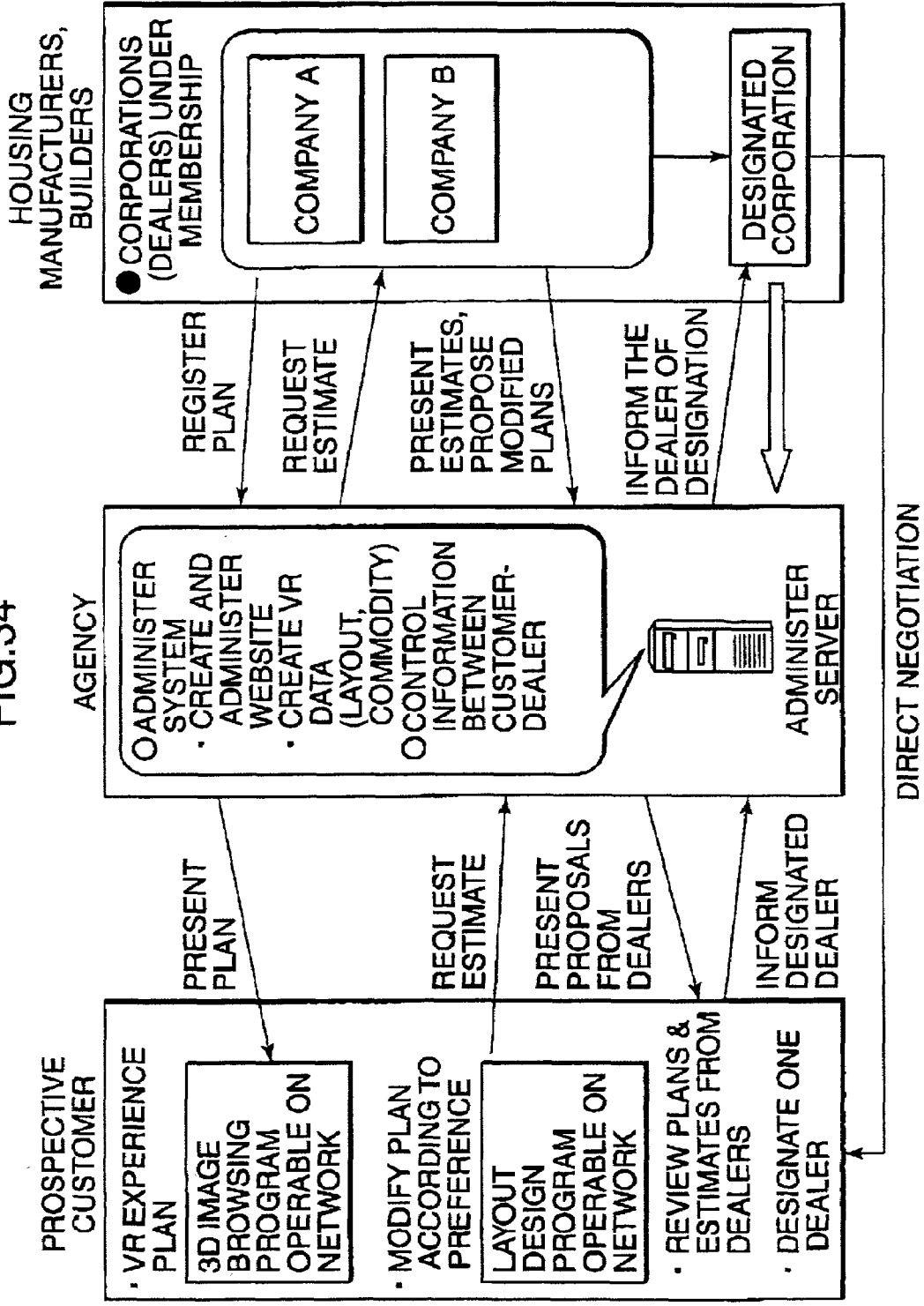
FIG. 34 is a diagram showing an entire configuration of a system in accordance with a seventh embodiment of this invention.

FIG. 34 is a diagram showing information flows in the seventh system. In FIG. 34, an agency is a main administrator of a server computer 20 who is a matchmaker between a customer who places an order of building a house and dealers (corporations). The agency administers a matchmaking site on the Internet, gathers customers and corporations under a membership as users of the seventh system, and administers information exchanged between the two parties until a contract is finalized. In the case where cost is involved in the contract, the agency implements a function as a site for motivating submission of conditional purchase offer or its equivalent with respect to a house at issue.

Since the seventh system is so configured as to let the agency administer information exchanged between customers and corporations until a contract is finalized, this configuration is advantageous in the allowing aspect. There is information (such as name, telephone number, credit number) that both of the parties are hesitant to reveal at an initial stage of negotiation. Negligence of disclosure of such information may lead to a trouble in the future. In order to prevent such a trouble, the agency gives credit to the information. For instance, the agency verifies identification of a customer and a dealer on his/her own credit to avoid cases that a customer makes inquiry merely from his/her interest, which is not profitable for dealers and that a customer may be cheated or involved in a malignant action of a so-called "deadbeat" dealer. With this configuration, a customer does not have to verify credibility of dealers engaged in construction business by himself.

With this configuration, corporations can ask the agency for gathering prospective customers on the website provided by the agency by setting a certain requirement (for example, houses are provided for prospective customers who wish to live in an urban area). Then, the agency administers in such a manner that the corporations are immediately informed of prospective customers who meet the requirement of the corporations upon receiving an access from such prospective customers.

As shown in FIG. 34, in the seventh system, an agency exists as a matchmaker or establishing a relation between a prospective customer who plans to purchase a house and dealers related to construction business (including designers) such as housing manufacturers and builders.

In the seventh system, a dealer (user) who wants to find a customer who plans to purchase a house registers and obtains a corporation membership on the homepage administered by the agency. At this time, the dealer registers basic plans of construction providable on the server computer administered by the agency, And publicizes the plans on the website of the agency.

A prospective customer (user) who plans to purchase a house also registers and obtains a customer membership on the website of the agency. Thereafter, the prospective customer views the basic plans registered on the website administered by the agency, selects a plan which is most close to his/her preference, and modifies the plan according to his/her preference by using a layout design program in a similar manner as in the first embodiment.

With this configuration, the customer can create a layout plan easily without a basic knowledge about house design. Layout modification may be performed by the customer (user) as shown in FIG. 35. In the case where there are several modified plans available based on the be plan, the customer may select one among the modified plans. Contents relating to modification can be reviewed on real-time basis in the terms of a 3D image by using a 3D display program in a similar manner as in the first embodiment.

When the customer is satisfied with a design plan of a house, he/she asks estimate about the design plan. At this time, the customer requests estimate to the dealer (such as housing manufacturer and builder) by way of the agency. The customer can ask several dealers or one specific dealer for estimate. In the case where information is limited because the customer lives in a remote area or the like, a most appropriate dealer may be automatically designated based on the information relating to the corporation memberships registered in the server computer, and the request of estimate may be sent to the designated dealer.

Upon receiving request of estimate, the dealers propose revised or modified plans which they think it realizable along with the estimate. At this time, the system administered by the agency may be provided with a configuration which enables the two parties to perform Q&A about insufficient information regarding the estimate. At this stage, the customer having customer membership and the dealers having corporation membership do not know mutual contact addresses. However, the two parties can exchange information including contact address) through the agency. Estimates and proposals submitted from the dealers are presented to the customer on the website of the agency. At this time, it is preferable to provide constraint such as password protection to ban the third party from browsing the estimates and proposals.

If the customer finds a satisfactory proposal, the customer designates the dealer who submitted the proposal by way of the agency. Then, the agency administers in such a manner that the customer and the designated dealer are informed of their mutual detailed data for identifying the customer and the dealer. Upon finalization of a contract, a certain commission fee is paid to the agency from the dealer who succeeded in securing the contract. With this configuration, there can be provided an environment under which the customer and the dealers housing providers) can negotiate at a low cost. In the case where the first proposal did not lead to a successful result, negotiation is carried on by asking estimate again with respect to a modified layout created based on the proposed plan, asking estimate for a different dealer, or by attaching a further requirement.

There is a case that as negotiation is extended, burden on the dealer increases. In such a case, the dealer may deadline participation in the negotiation, which is not desirable both for the customer and the dealer. To avoid such an undesirable situation, there may be provided conditions such as allowable contact period within which a customer is requested to determine a dealer from a first contact (negotiation) or an upper limit number of times which is allowed for a customer to ask plan modification.

The aforementioned section describes a procedure from the initial stage of negotiation up to determination of the housing provider (dealer). In the case where a negotiation is proceeded further by utilizing the website of the agency, the seventh system may be so configured as to collect a surcharge from the customer or from the housing provider.

As this invention may be embodied in several forms without departing from the spirit of essential characteristics thereof, the present embodiment is therefore illustrative an not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. A method for aiding design of a building on a computer accessible to a server computer via a network, the server computer storing a layout design program operable on a screen activated by a browser of a first client computer to enable a user to implement design of a layout of a building by creating a room and adding fixtures to the room, the layout being represented in 2D, an object database storing fixture data used in the layout design for retrieval and extraction, and a 3D display program operable on the browser screen of the first client computer to display the designed building in 3D, the method comprising:

transmitting data relating to a designed layout of a building from a second client computer to the server computer;

storing the supplied data relating to a designed layout of a building in an information provider database;

accessing the server computer with the browser of the first client computer;

transmitting the layout design program and the 3D display program to the browser of the first client computer from the server computer via the network;

transmitting the stored data relating to a designed layout of a building to the first client computer; and transmitting fixture data stored in the object database from the server computer via the network in response to a request from the layout design program when it is active on the browser screen of the first client computer, wherein the 3D display program is configured to allow a user to modify a part of the designed building itself while the building is displayed in 3D, and the layout design program enables the user to define a room by changing a tone of selected squares defined by grid lines displayed on a browsed screen in 2D, and to add fixtures and other rooms outside of the room, or enables the user to draw an outline of a room with reference to grid lines displayed on a browsed screen in 2D, the layout design program superimposing a layout of an upper floor over a layout of a lower floor in 2D when a layout of the upper floor is being designed.

2. A method for aiding design of a building according to claim 1, wherein the server computer stores an interior simulation program that displays images of an interior of the designed building, and the method further comprises transmitting the interior simulation program to the first client computer, the interior simulation program being configured to display an image rendering area on the browser screen which alternately displays 2D images and 3D images of the designed building and displays a mark on a 2D image of the designed building which illustrates a viewpoint of a 3D image displayed in the image rendering area.

3. A system for aiding design of a building with a computer, the system comprising a server computer, and a client computer accessible to the server computer via a network, wherein the server computer stores:

a layout design program which is operable on a screen activated by a browser of the client computer to enable a user to implement design of a layout of the building by creating a room and adding fixtures to the room, the layout being represented in 2D, the layout design program enabling the user to define a room by changing a tone of selected squares defined by grid lines displayed on a browsed screen in 2D, and to add fixtures and other rooms outside of the room, or enabling the user to draw an outline of a room with reference to grid lines displayed on a browsed screen in 2D, the layout design program superimposing a layout of an upper floor over a layout of a lower floor in 2D when a layout of the upper floor is being designed, an object database which stores fixture data used in layout design for retrieval and extraction, a 3D display program which is operable on the browser screen of the client computer to display the designed building in 3D, the 3D display program being configured to allow a user to modify a part of the designed building itself while the building is displayed in 3D, and an information provider database configured to store data relating to a designed layout of a building supplied from a first client computer, and to provide a second client computer with the stored data, wherein the server computer is configured to transmit the layout design program, the fixture data stored in the object database, and the 3D display program to the client computer in response to a request from the client computer via the network;

the client computer is provided with a browser capable of activating the layout design program and the 3D display program, and is configured to activate the layout design program and the 3D display program on the browser screen upon receiving the layout design program and the 3D display program from the server computer via the network; and the layout design program is configured to request and obtain the fixture data from the object database of the server computer via the network during activation of the layout design program on the browser screen of the client computer for utilization in layout design.

4. A system for aiding design of a building according to claim 3, wherein the server computer stores an interior simulation program that displays images of an interior of the designed building, and transmits the interior simulation program to the client computer, the interior simulation program being configured to display an image rendering area on the browser screen which alternately displays 2D images and 3D images of the designed building and displays a mark on a 2D image of the designed building which illustrates a viewpoint of a 3D image displayed in the image rendering area.

5. A server computer for use in a design aiding system which aids a design of a building on a client computer accessible to the server computer via a network, wherein the server computer stores:

a layout design program which is operable on a screen activated by a browser of the client computer to enable the client computer to implement design of a layout of the building by creating a room and adding fixtures to the room in 2D, the layout design program enabling a user to define a room by changing a tone of selected squares defined by grid lines displayed on a browsed screen in 2D, and to add fixtures and other rooms outside of the room, or enabling the user to draw an outline of a room with reference to grid lines displayed on a browsed screen in 2D, the layout design program superimposing a layout of an upper floor over a layout of a lower floor in 2D when a layout of the upper floor is being designed, an object database which stores fixture data used in layout design for retrieval and extraction, a 3D display program which is operable on the browser screen of the client computer to display the designed building in 3D, the 3D display program being configured to allow a user to modify a part of the designed building itself while the building is displayed in 3D; and an information provider database configured to store data relating to a designed layout of a building supplied from a first client computer, and to provide a second client computer with the stored data, wherein the server computer is configured to transmit the layout design program, the fixture data stored in the object database, and the 3D display program to the client computer in response to a request from the client computer via the network; and the layout design program is configured to request and obtain data from the object database of the server computer via the network during activation of the browser of the client computer for utilization in layout design.

6. The server computer according to claim 5, wherein the 3D display program transforms 2D images of a designed layout into 3D images for 3D image display.

7. The server computer according to claim 6, wherein the 3D display program displays a designed space in 3D after the layout design is completed by the layout design program.

8. The server computer according to claim 7, wherein the 3D display program transforms 2D images of a designed layout into 3D images for 3D image display after the layout design is completed by the layout design program.

9. The server computer according to claim 6, wherein the 3D display program transforms 2D images of a designed layout into 3D images for 3D image display each time a fixture is added to a room.

10. The server computer according to claim 9, wherein the 3D display program displays 3D images each time a fixture is added to a room.

11. The server computer according to claim 5, wherein the layout design program enables the user to revise the layout of the building in 3D, and display the layout of the building in 2D.

12. The server computer according to claim 5, wherein the layout design program automatically links stairs between a lower floor and a middle floor, and between a middle floor and an upper floor, when the middle floor is designed to include stairs between the lower floor and the middle floor, and the middle floor and the upper floor.

13. The server computer according to claim 5, wherein the layout design program stores layout data of the designed building in a predetermined storage region of either of the client computer and the server computer.

14. The server computer according to claim 13, wherein the layout design program reads the layout data of the designed building from a predetermined storage region of either the client computer and the server computer to allow revision of the layout data.

15. The server computer according to claim 14, wherein the layout design program reads the layout data from the predetermined storage region, and displays the layout of the building based upon the read-out data and revisions to the layout.

16. The server computer according to claim 5, wherein the server computer stores an interior simulator program which enables the user to implement interior simulation by jointly displaying an interior of a designed room and interior-related objects, including interior commodities including furniture, and is configured to transmit the interior simulator program to the client computer via the network upon receiving a request from the client computer, and the interior simulator program is configured to obtain interior-related object data representing interior-related objects via the network from an interior-related object database which stores the interior-related object data for retrieval and extraction during activation of the browser of the client computer so as to enable the user to implement the interior simulation.

17. The server computer according to claim 16, wherein the interior simulator program specifies a position of the interior related object relative to the designed room, along with information which specifies interior-related objects selected in the interior simulation, and stores the position along with the interior-related information in a predetermined storage region of either of the client computer and the server computer.

18. The server computer according to claim 16, wherein the interior-related object database includes a commodity database which stores data relating to the interior commodities including furniture created by a dealer selling the interior commodities.

19. The server computer according to claim 5, wherein the layout design program sets a site where the building to be designed by the layout design program is to be built such that the layout of the building is designed in relation to the site.

20. The server computer according to claim 5, wherein the layout design program obtains frame information relating to a frame of a building constructed according to a skeleton-infill technique from a frame information database which stores the frame information, including information relating to a pillar, a beam, and plumbing, to implement layout design within constraints accompanied by the layout design based on the obtained frame information.

21. The server computer according to claim 5, wherein the information provider database includes a land information database which is configured to enable the first client computer to register information relating to a site based on which the layout design is implemented, the site being an area within which a building is authorized to be built according to a construction regulation, along with information relating to land to be sold by a user of the first client computer and to provide the second client computer with land information along with the site information, the user of the first client computer including a seller of the land or an agency dealing with sales of the land, and the second client computer being a prospective purchaser who plans to purchase the land.

22. The server computer according to claim 5, wherein the information provider database includes a design information database which is configured to receive registration of information relating to a plurality of layouts designed with the first client computer, and to provide the second client computer with the plurality of layout information, the first client computer being used by a plurality of designers, and the second client computer being used by a customer who plans to place order to build a building.

23. The server computer according to claim 5, wherein the information provider database includes a rental housing information database which is configured to receive registration of information relating to a layout of a rental housing and to enable the second client computer to browse the layout information of the rental housing, the first client computer being provided for a lender of the rental housing, and the second client computer being provided for a prospective lessee of the rental housing.

24. The server computer according to claim 23, wherein the rental housing information database is configured to enable the first client computer to register information relating to a rental housing along with the layout information of the rental housing.

25. The server computer according to claim 5, wherein the server computer includes a contractor administration database for discriminating whether the user reached an agreement to allow utilization of the system, and is configured to restrict utilization of the object data from the object database by the user in the case where it is judged that the user has not reached the agreement.

26. A server computer for use in a design aiding system according to claim 5, wherein the server computer stores an interior simulation program that displays images of an interior of the designed building, and transmits the interior simulation program to the client computer, the interior simulation program being configured to display an image rendering area on the browser screen which alternately displays 2D images and 3D images of the designed building and displays a mark on a 2D image of the designed building which illustrates a viewpoint of a 3D image displayed in the image rendering area.

27. A system for aiding design of a layout of a building with a computer, the system comprising a server computer, and a client computer accessible to the server computer via a network, wherein the server computer stores:

an object database which is operable on a screen activated by a browser of the client computer and stores fixture data used in layout design for retrieval and extraction in association with an operation of a layout design program which enables a user to implement design of a layout of the building by creating a room and adding fixtures to the room in 2D;

a 3D display program which is operable on the browser screen of the client computer to display the designed layout in 3D, the 3D display program being configured to allow a user to modify a part of the designed building itself while the building is displayed in 3D; and an information provider database configured to store data relating to a designed layout of a building supplied from a first client computer, and to provide a second client computer with the stored data, wherein the server computer is configured to transmit the fixture data stored in the object database and the 3D display program to the client computer in response to a request from the client computer via the network;

the client computer is provided with a layout design program and a browser capable of activating the layout design program and the 3D display program, and is configured to activate the 3D display program on the browser screen upon receiving the 3D display program from the server computer via the network; and the layout design program obtains the fixture data from the object database of the server computer via the network during activation of the browser of the client computer for utilization in the layout design, the layout design program enabling the user to define a room by changing a tone of selected squares defined by grid lines displayed on a browsed screen in 2D, and to add fixtures and other rooms outside of the room, or enabling the user to draw an outline of a room with reference to grid lines displayed on a browsed screen in 2D, the layout design program superimposing a layout of an upper floor over a layout of a lower floor in 2D when a layout of the upper floor is being designed.

28. A system for aiding design of a layout of a building, the system comprising a server computer, and a client computer accessible to the server computer via a network, wherein the server computer stores:

a layout design program which is operable on a screen activated by a browser of the client computer to enable a user to implement design of a layout of a building by creating a room and adding fixtures to the room in 2D, the layout design program enabling the user to define a room by changing a tone of selected squares defined by grid lines displayed on a browsed screen in 2D, and to add fixtures and other rooms outside of the room, or enabling the user to draw an outline of a room with reference to grid lines displayed on a browsed screen in 2D, the layout design program superimposing a layout of an upper floor over a layout of a lower floor in 2D when a layout of the upper floor is being designed;

an object database which stores fixture data used in layout design for retrieval and extraction; and an information provider database configured to store data relating to a designed layout of a building supplied from a first client computer, and to provide a second client computer with the stored data, wherein the server computer is configured to transmit the layout design program and the fixture data stored in the object database to the client computer in response to a request from the client computer via the network;

the client computer is provided with a browser capable of activating the layout design program, equipped with a 3D display program which is operable on the browser screen of the client computer to display the designed space in 3D, and is configured to activate the layout design program on the browser screen upon receiving the layout design program via the network from the server computer, the 3D display program being configured to allow a user to modify a part of the designed building itself while the building is displayed in 3D; and the layout design program obtains the fixture data from the object database via the network during activation of the layout design program on the browser screen of the client computer for utilization in layout design.

29. A system for aiding design of a layout of a building, the system comprising a server computer, and a client computer accessible to the server computer via a network, wherein the server computer stores:

a layout design program which is operable on a screen activated by a browser of the client computer to enable a user to implement design of a layout of a building by creating a room and adding fixtures to the room in 2D, the layout design program enabling the user to define a room by changing a tone of selected squares defined by grid lines displayed on a browsed screen in 2D, and to add fixtures and other rooms outside of the room, or enabling the user to draw an outline of a room with reference to grid lines displayed on a browsed screen in 2D, the layout design program superimposing a layout of an upper floor over a layout of a lower floor in 2D when a layout of the upper floor is being designed;

a 3D display program which is operable on the browser screen of the client computer to display the designed space in 3D, the 3D display program being configured to allow the user to modify a part of the designed building itself while the building is displayed in 3D; and an information provider database configured to store data relating to a designed layout of a building supplied from a first client computer, and to provide a second client computer with the stored data, the server computer is configured to transmit the layout design program and the 3D display program to the client computer in response to a request from the client computer via the network;

the client computer is provided with a browser capable of activating the layout design program and the 3D display program, equipped with an object database which stores fixture data used in layout design for retrieval and extraction, and is configured to activate the layout design program and the 3D display program on the browser screen upon receiving the layout design program and the 3D display program via the network from the server computer; and the layout design program obtains the fixture data from the object database during activation of the layout design program on the browser screen of the client computer for utilization in layout design.

\* \* \* \* \*